(12) United States Patent
Das et al.

(10) Patent No.: US 9,786,633 B2
(45) Date of Patent: Oct. 10, 2017

(54) INTERCONNECT STRUCTURES FOR FINE PITCH ASSEMBLY OF SEMICONDUCTOR STRUCTURES AND RELATED TECHNIQUES

(71) Applicant: Massachusetts Institute of Technology, Cambridge, MA (US)

(72) Inventors: Rabindra N. Das, Lexington, MA (US); Peter G. Murphy, Chelmsford, MA (US); Karen E. Magoon, Nashua, NH (US); Noyan Kinayman, Lexington, MA (US); Michael J. Barbieri, Littleton, MA (US); Timothy M. Hancock, Somerville, MA (US); Mark A. Gouker, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 237 days.

(21) Appl. No.: 14/694,540

(22) Filed: Apr. 23, 2015

(65) Prior Publication Data
US 2017/0098627 A1    Apr. 6, 2017

Related U.S. Application Data

(60) Provisional application No. 61/983,122, filed on Apr. 23, 2014.

(51) Int. Cl.
*H01L 25/065* (2006.01)
*H01L 23/00* (2006.01)

(52) U.S. Cl.
CPC .......... *H01L 25/0657* (2013.01); *H01L 24/02* (2013.01); *H01L 24/03* (2013.01);
(Continued)

(58) Field of Classification Search
CPC .......... H01L 21/44; H01L 29/92; H01L 21/28; H01L 51/19; H01L 51/40; H01L 21/768;
(Continued)

(56) References Cited

U.S. PATENT DOCUMENTS

| 4,316,200 A | 2/1982 | Ames et al. |
| 4,612,083 A | 9/1986 | Yasumoto et al. |

(Continued)

FOREIGN PATENT DOCUMENTS

WO    WO 2017/015432 A1    1/2017

OTHER PUBLICATIONS

PCT International Search Report of the ISA for Appl. No. PCT/US2016/060263 dated Jan. 10, 2017; 3 pages.
(Continued)

*Primary Examiner* — Alexander Oscar Williams
(74) *Attorney, Agent, or Firm* — Daly, Crowley, Mofford & Durkee, LLP

(57) ABSTRACT

A semiconductor structure includes a substrate having first and second opposing surfaces and a plurality of electrical connections extending between the first and second surfaces. The semiconductor structure also includes one or more interconnect pads having first and second opposing surfaces and one or more sides. The first surface of each one of the interconnect pads is disposed over or beneath select portions of at least the second surface of the substrate and is electrically coupled to select ones of the plurality of electrical connections. The semiconductor structure additionally includes an isolating layer having first and second opposing surfaces and openings formed in select portions of the isolating layer extending between the second surface of the isolating layer and the second surfaces of the interconnect pads. A corresponding method for fabricating a semiconductor structure is also provided.

26 Claims, 17 Drawing Sheets

(52) U.S. Cl.
CPC .............. *H01L 24/04* (2013.01); *H01L 24/05* (2013.01); *H01L 24/13* (2013.01); *H01L 24/16* (2013.01); *H01L 2224/0235* (2013.01); *H01L 2224/02371* (2013.01); *H01L 2224/02381* (2013.01); *H01L 2224/03013* (2013.01); *H01L 2224/0362* (2013.01); *H01L 2224/03466* (2013.01); *H01L 2224/0401* (2013.01); *H01L 2224/05551* (2013.01); *H01L 2224/05558* (2013.01); *H01L 2224/10126* (2013.01); *H01L 2224/10145* (2013.01); *H01L 2224/13007* (2013.01); *H01L 2224/13016* (2013.01); *H01L 2224/13026* (2013.01); *H01L 2224/16147* (2013.01); *H01L 2225/06513* (2013.01); *H01L 2924/381* (2013.01)

(58) Field of Classification Search
CPC ... H01L 25/06547; H01L 24/02; H01L 24/13; H01L 24/16; H01L 24/04; H01L 24/05; H01L 24/03
USPC .......... 257/738, 737, 778, 773, 774; 438/653
See application file for complete search history.

(56) References Cited

U.S. PATENT DOCUMENTS

| | | | |
|---|---|---|---|
| 5,057,877 | A | 10/1991 | Briley et al. |
| 5,773,875 | A | 6/1998 | Chan |
| 6,108,214 | A | 8/2000 | Fuse |
| 6,297,551 | B1 | 10/2001 | Dudderar et al. |
| 6,324,755 | B1 | 12/2001 | Borkowski et al. |
| 6,396,371 | B2 | 5/2002 | Streeter et al. |
| 6,436,740 | B1* | 8/2002 | Jen .................... H01L 29/66765 257/E21.414 |
| 6,485,565 | B1 | 11/2002 | Springer |
| 6,819,000 | B2 | 11/2004 | Magerlein et al. |
| 6,838,774 | B2 | 1/2005 | Patti |
| 7,427,803 | B2 | 9/2008 | Chao et al. |
| 7,589,390 | B2 | 9/2009 | Yao |
| 7,624,088 | B2 | 11/2009 | Johnson et al. |
| 7,932,515 | B2 | 4/2011 | Bunyk |
| 8,202,785 | B2 | 6/2012 | Castex et al. |
| 8,466,036 | B2 | 6/2013 | Brindle et al. |
| 8,487,444 | B2 | 7/2013 | Law et al. |
| 8,492,911 | B2 | 7/2013 | Bachman et al. |
| 8,519,543 | B1 | 8/2013 | Song et al. |
| 8,564,955 | B2 | 10/2013 | Schmidt et al. |
| 8,736,068 | B2 | 5/2014 | Bartley et al. |
| 8,754,321 | B2 | 6/2014 | Schroeder et al. |
| 8,828,860 | B2 | 9/2014 | Gruber et al. |
| 8,928,128 | B2 | 1/2015 | Karikalan et al. |
| 8,954,125 | B2 | 2/2015 | Gonzalez et al. |
| 9,076,658 | B1 | 7/2015 | Brown et al. |
| 9,171,792 | B2 | 10/2015 | Sun et al. |
| 2001/0016383 | A1 | 8/2001 | Chen et al. |
| 2002/0094661 | A1 | 7/2002 | Enquist et al. |
| 2003/0067073 | A1 | 4/2003 | Akram et al. |
| 2004/0124538 | A1 | 7/2004 | Reif et al. |
| 2004/0188845 | A1 | 9/2004 | Iguchi et al. |
| 2007/0087544 | A1* | 4/2007 | Chang .................... H01L 24/03 438/612 |
| 2007/0207592 | A1 | 9/2007 | Lu et al. |
| 2008/0093747 | A1 | 4/2008 | Enquist et al. |
| 2008/0122115 | A1 | 5/2008 | Popa et al. |
| 2008/0169559 | A1* | 7/2008 | Yang .................... H01L 24/03 257/737 |
| 2008/0230916 | A1 | 9/2008 | Saito et al. |
| 2008/0290790 | A1* | 11/2008 | Jin .................... H01L 27/3246 313/504 |
| 2009/0078966 | A1* | 3/2009 | Asai .................. H01L 29/66462 257/194 |
| 2009/0173936 | A1 | 7/2009 | Bunyk |
| 2009/0186446 | A1 | 7/2009 | Kwon et al. |
| 2009/0233436 | A1* | 9/2009 | Kim .................... H01L 24/11 438/614 |
| 2010/0001399 | A1* | 1/2010 | Topacio .............. H01L 23/3171 257/737 |
| 2010/0130016 | A1 | 5/2010 | DeVilliers |
| 2010/0148371 | A1 | 6/2010 | Kaskoun et al. |
| 2010/0171093 | A1 | 7/2010 | Kabir |
| 2011/0049675 | A1* | 3/2011 | Nagai .................... H01L 24/03 257/532 |
| 2011/0140271 | A1* | 6/2011 | Daubenspeck ... H01L 23/49816 257/738 |
| 2011/0189820 | A1 | 8/2011 | Sasaki et al. |
| 2011/0204505 | A1 | 8/2011 | Pagaila et al. |
| 2011/0237069 | A1* | 9/2011 | Miyazaki .......... H01L 21/76808 438/653 |
| 2011/0248396 | A1 | 10/2011 | Liu et al. |
| 2012/0074585 | A1 | 3/2012 | Koo et al. |
| 2012/0228011 | A1* | 9/2012 | Chang .................... H01L 24/13 174/257 |
| 2012/0231621 | A1* | 9/2012 | Chang .................... H01L 24/11 438/613 |
| 2012/0252189 | A1 | 10/2012 | Sadaka et al. |
| 2012/0292602 | A1* | 11/2012 | Guo .................. H01L 29/66515 257/40 |
| 2013/0029848 | A1 | 1/2013 | Gonzalez et al. |
| 2013/0093104 | A1* | 4/2013 | Wu .................... H01L 23/291 257/782 |
| 2013/0099235 | A1 | 4/2013 | Han |
| 2013/0147036 | A1 | 6/2013 | Choi et al. |
| 2013/0153888 | A1 | 6/2013 | Inoue et al. |
| 2013/0187265 | A1* | 7/2013 | Shih .................... H01L 24/11 257/737 |
| 2013/0244417 | A1 | 9/2013 | Markunas et al. |
| 2014/0001604 | A1 | 1/2014 | Sadaka |
| 2014/0113828 | A1 | 4/2014 | Gilbert et al. |
| 2014/0246763 | A1 | 9/2014 | Bunyk |
| 2015/0041977 | A1 | 2/2015 | Daubenspeck et al. |
| 2015/0054151 | A1 | 2/2015 | Choi et al. |
| 2015/0054167 | A1 | 2/2015 | Pendse |
| 2015/0054175 | A1 | 2/2015 | Meinhold et al. |

OTHER PUBLICATIONS

PCT Written Opinion of the ISA for Appl. No. PCT/US2016/060263 dated Jan. 10, 2017; 6 pages.
U.S. Appl. No. 15/303,800, filed Oct. 13, 2016, Das, et al.
U.S. Appl. No. 15/312,063, filed Nov. 17, 2016, Das, et al.
Search Report and Written Opinion dated Nov. 4, 2015 for PCT Application No. PCT/US2015/044651; 15 pages.
Search Report and Written Opinion dated Dec. 31, 2105 for PCT Application No. PCT/US2015/044608; 12 pages.
PCT Application As filed on Aug. 11, 2015 for PCT Application No. PCT/US2015/044608; 64 pages.
PCT Application As filed on Aug. 11, 2015 for PCT Application No. PCT/US2015/044679; 57 pages.
PCT Application As filed on Aug. 11, 2015 for PCT Application No. PCT/US2015/044651; 67 pages.
PCT Application As filed on Nov. 5, 2015 for PCT Application No. PCT/US2015/059181; 68 pages.
PCT Application As filed on Nov. 5, 2015 for PCT Application No. PCT/US2015/059200; 72 pages.
U.S. Appl. No. 15/342,478, filed Nov. 3, 2016, Oliver, et al.
U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarnlowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.

(56) References Cited

OTHER PUBLICATIONS

PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
Burns, et al.; "3D Circuit Integration Technology for Multiproject Fabrication;"MIT Lincoln Laborator Presentation; Apr. 7, 2000; 15 pages.
Courtland: "Google Aims for Quantum Computing Surpremacy,"Spectruum.IEEE.Org; North America; Jun. 2017; 2 pages.
International Search Report of the ISA for pCT Appl. No. PCT/US2016/060343 dated Jul 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 24, 2017 for U.S. Appl. No. 15/303,800 filed Jun. 26, 2017; 22 pages.
Response to Restriction Requirement dated May 16, 2017 for U.S. Appl. No. 15/327,249 filed on Jun. 27, 2017, 1 page.
Reponse to Restriction Requirement dated Jun. 8, 2017 for U.S. Appl. No. 15/271,755 filed on Jun. 19, 2017; 1 page.

* cited by examiner

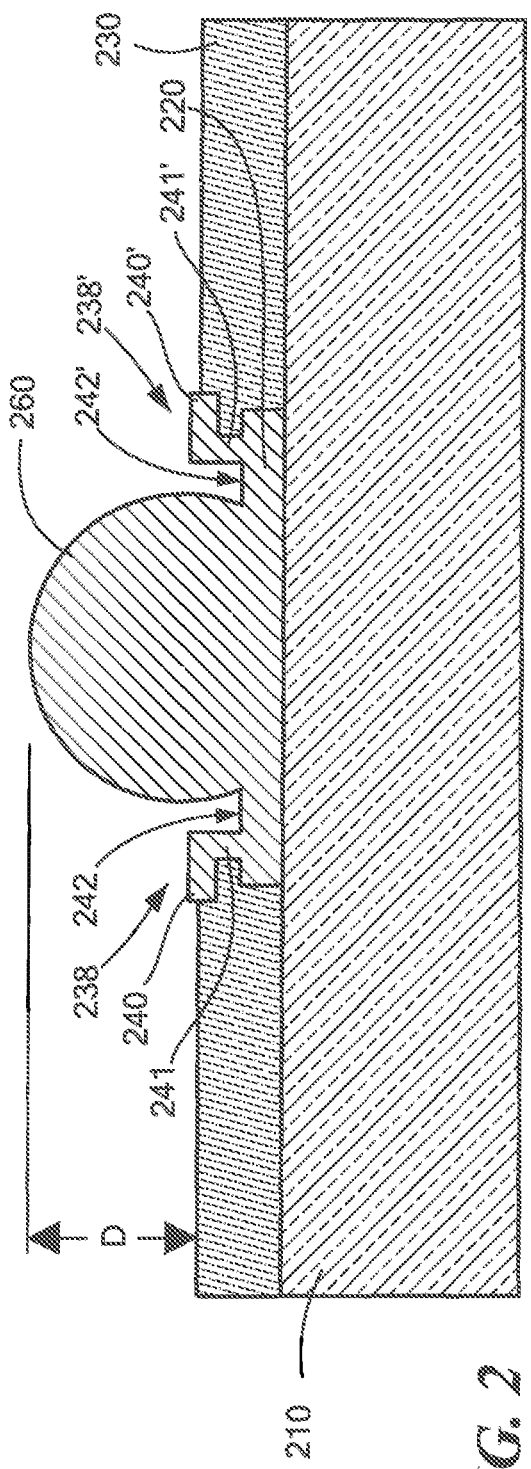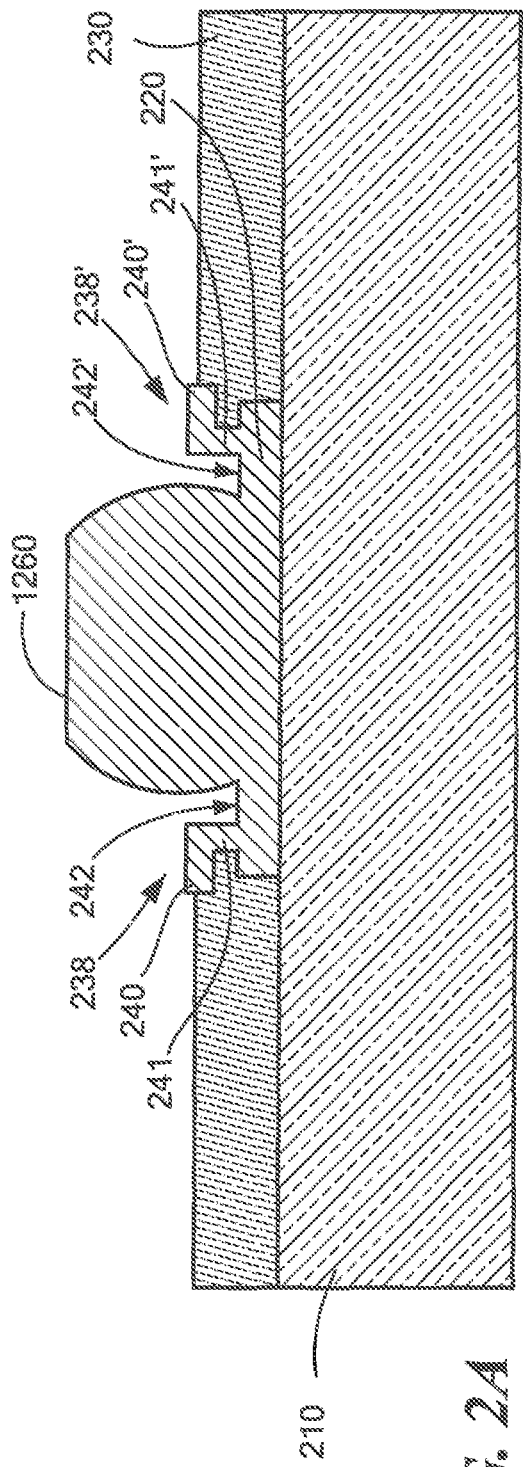

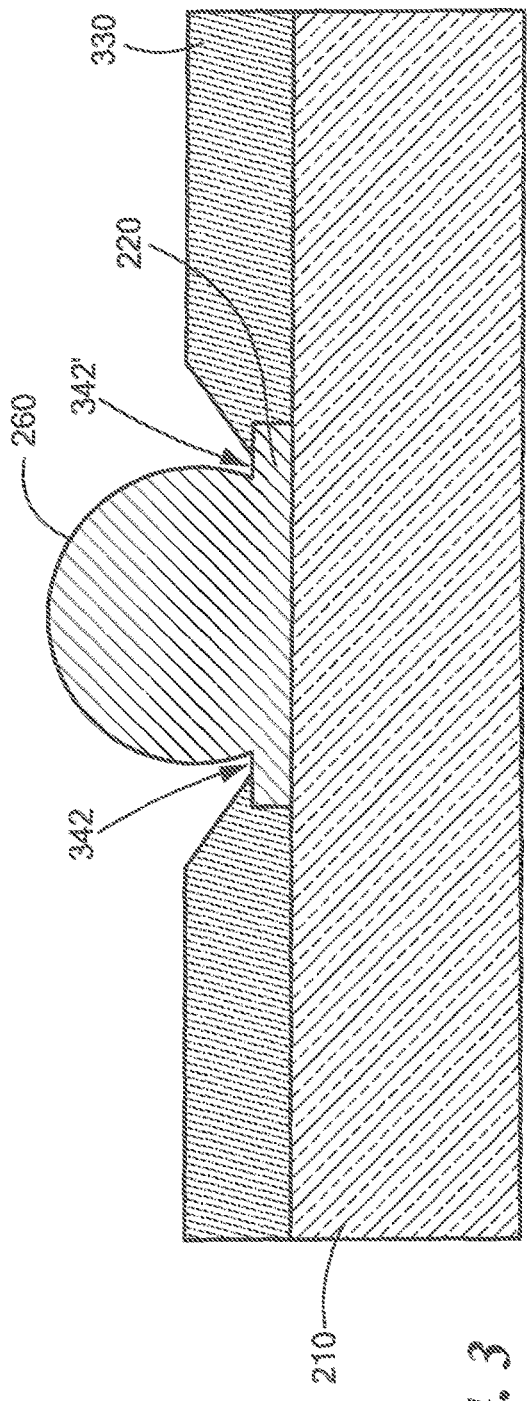
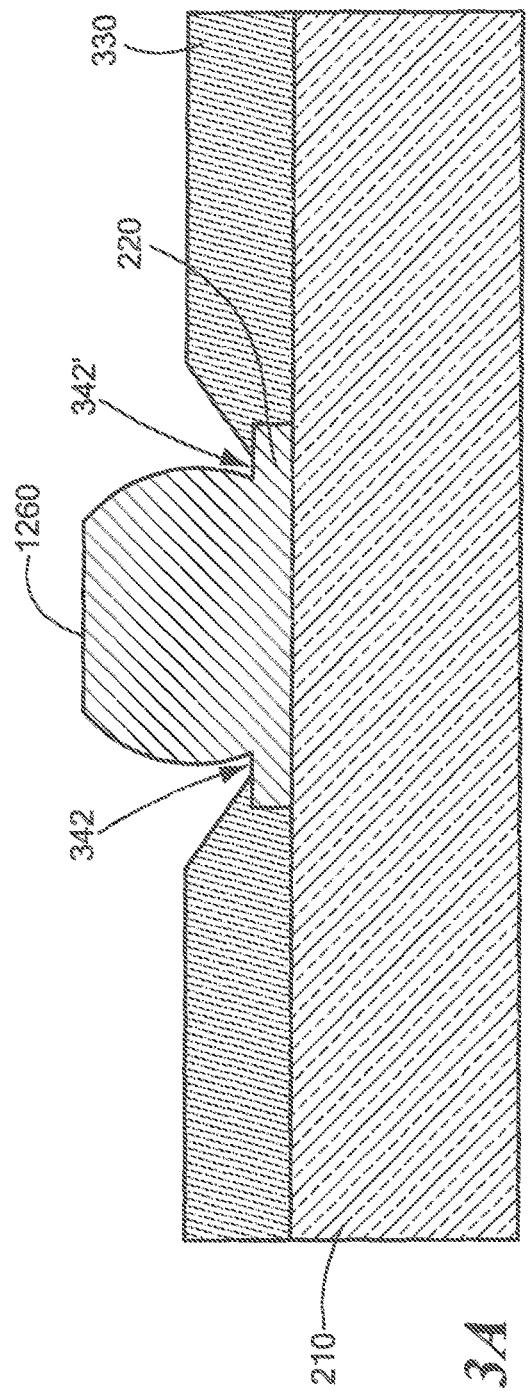
FIG. 3
FIG. 3A

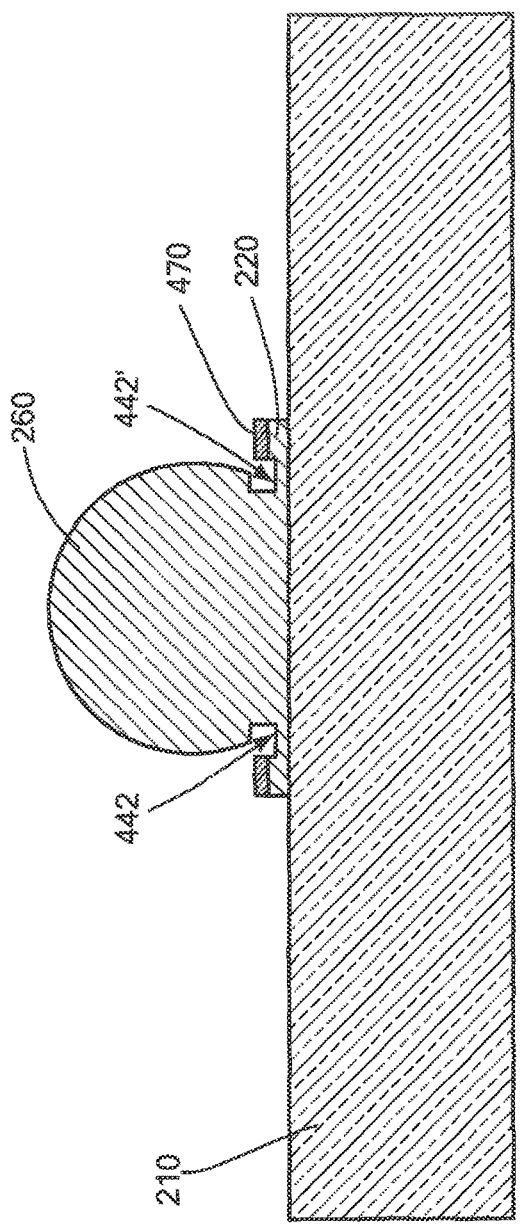
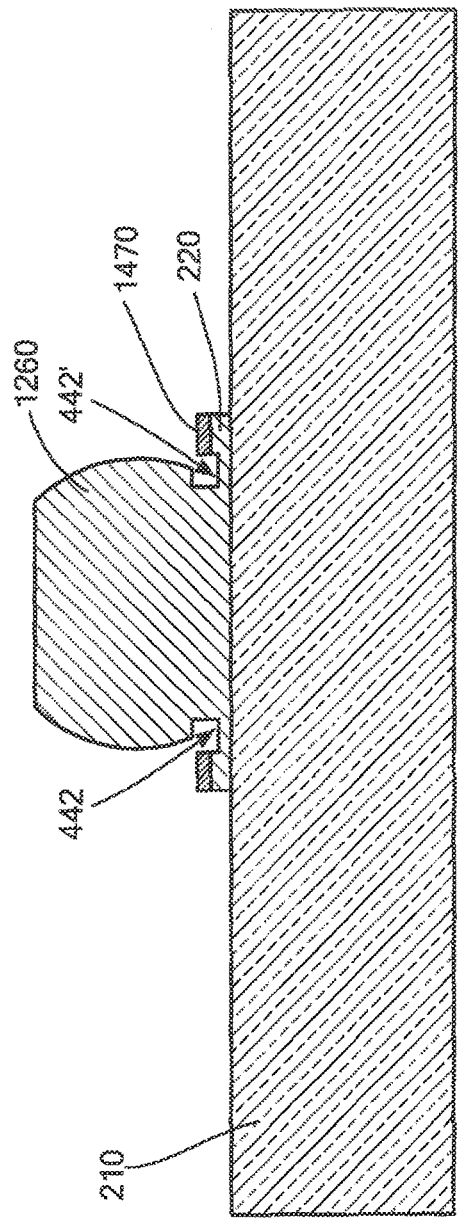
FIG. 4
FIG. 4A

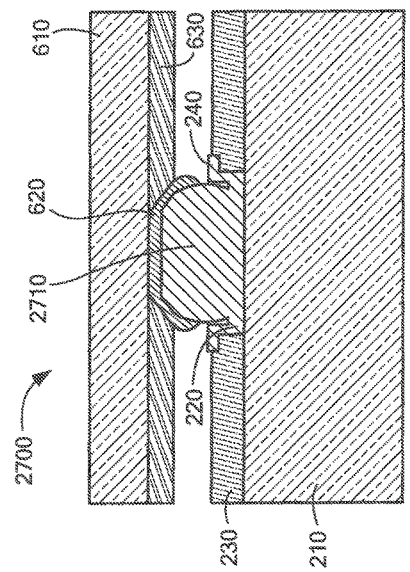
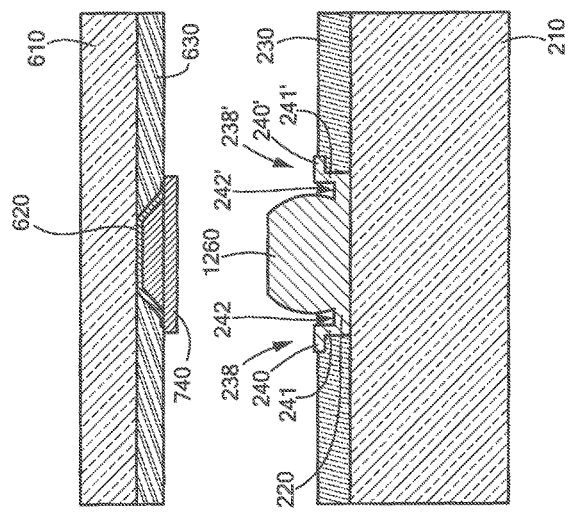

INTERCONNECT STRUCTURES FOR FINE PITCH ASSEMBLY OF SEMICONDUCTOR STRUCTURES AND RELATED TECHNIQUES

CROSS REFERENCE TO RELATED APPLICATION

This application claims the benefit of U.S. Provisional Application No. 61/983,122 filed Apr. 23, 2014 under 35 U.S.C. §119(e) which application is hereby incorporated herein by reference in its entirety.

GOVERNMENT RIGHTS

This invention was made with government support under Contract No. FA8721-05-C-0002 awarded by the U.S. Air Force. The government has certain rights in the invention.

FIELD

This disclosure relates generally to semiconductor structures, and more particularly, to semiconductor interconnect structures which enable fine pitch assembly of semiconductor structures and devices.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, drives a need for multi-layer semiconductor structures (also commonly referred to as three-dimensional (3-D) integrated circuits (ICs)), semiconductor structures in which a number of individual semiconductor structures are both mechanically and electrically coupled. One example multi-layer semiconductor structure is described in U.S. Pat. No. 7,067,909 entitled "Multi-layer integrated semiconductor structure having an electrical shielding portion," which is assigned to the assignee of the present disclosure and incorporated herein by reference in its entirety.

In fabricating multi-layer semiconductor structures, such as that which is described in the above-reference U.S. Pat. No. 7,067,909, for example, individual semiconductor structures are typically stacked, bonded (La mechanically coupled) and electrically coupled using one or more interconnects. Conventional interconnects include, for example, solder balls, self-aligned contact pads, bond wires, conductive pads and the like. Such interconnects, have an associated pitch. Typically, data and power signals (e.g., power/ground connections) flow through interconnects of the individual semiconductor structures.

While it is desirable to reduce interconnect pitch, a competing requirement is that relatively simple and cost effective approaches are needed in order for such to be practical.

SUMMARY

Described herein are concepts, systems, circuits and techniques related to a flip-chip interconnect structure suitable for integrating a standard semiconductor package into a finer pitch package. In one aspect, a micro ball/bump/pillar/stud-solder based the flip-chip interconnect structure is described.

In one aspect, an interconnect pad structure for a flip chip assembly reduces interconnect width which will allow to redesign a substrate have a first pitch to a substrate having a second pitch which is finer than the first pitch. The finer pitch substrate is provided by reducing interconnect pad size and/or reducing space between pads and or increasing number of lines per channel.

The present disclosure further describes circuits and techniques for fabricating semiconductor structures and devices having reduced pitch in comparison to conventional semiconductor structures and devices. The described circuitry and methods can, for example, be used to fabricate a semiconductor device comprising at least two semiconductor structures and to convert conventional semiconductor structures having a first pitch into semiconductor structures having a reduced pitch (i.e., having a "finer" pitch). Further, the described circuitry and methods may be found suitable in a variety of semiconductor packages and assemblies including, but not limited to: flip-chip-on-board (FCOB)-packaging, standard and fine pitch ball grid array (BGA) packaging, chip-scale package (CSP), system-in-package (SiP), and package-on-package (PoP) assemblies) and integrated circuit (IC) structures (e.g., 2D, 2.5D, and 3D IC structures).

In one aspect of the concepts described herein, a method for fabricating a semiconductor structure includes providing one or more interconnect pads on a substrate having first and second opposing surfaces and a plurality of electrical connections extending between the first and second surfaces. The first surface of each one of the interconnect pads is disposed over or beneath select portions of at least the second surface of the substrate and is electrically coupled to select ones of the plurality of electrical connections. The method additionally includes applying an isolating layer having first and second opposing surfaces. The first surface of the isolating layer is disposed over the second surface of the substrate and the second surfaces and one or more sides of the interconnect pads.

The method further includes forming openings having a predetermined shape in select portions of the isolating layer extending between the second surface of the isolating layer and the second surfaces of the interconnect pads over which the first surface of the isolating layer is disposed. In some embodiments, one or more of the openings may be formed before the isolating layer is applied. Additionally, in some embodiments, one or more of the opening may be formed after the isolating later is applied. The method also includes providing one or more pad interconnects having a pad portion and an interconnect portion. The pad portion of each one of the pad interconnects has a surface disposed over select portions of the second surface of the isolating layer. Additionally, the interconnect portion of each one of the pad interconnects extends from the pad portion to second surfaces of the interconnect pads and has a surface disposed over select edges of the openings formed in the isolating layer. The method additionally includes disposing one or more conductive structures in each of the openings formed in the isolating layer. The conductive structures are electrically coupled to second surfaces of the interconnect pads to form an interconnect for electrically and mechanically coupling the semiconductor structure to other semiconductor structures and devices.

The method may include one or more of the following features either individually or in combination with other features. Applying an isolating layer having first and second opposing surfaces may include disposing an isolating material over the second surface of the substrate and the second surfaces and one or more sides of the interconnect pads. Applying the isolating layer may also include exposing the isolating material to an exposure energy. Applying the isolating layer may additionally include curing the isolating material to form an isolating layer having first and second opposing surfaces. The first surface of the isolating layer may be disposed over the second surface of the substrate and the second surfaces and one or more sides of the interconnect pads. Exposing the isolating material to an exposure energy may include exposing the isolating material to an exposure energy having a predetermined intensity distribution and developing the isolating material.

Forming openings having a predetermined shape in select portions of the isolating layer may include exposing the isolating layer to an exposure energy having a predetermined intensity distribution such that openings having a predetermined shape are formed in select portions of the isolating layer extending between the second surface of the isolating layer and the second surfaces of the interconnect pads over which the first surface of the isolating layer is disposed. Forming openings having a predetermined shape in select portions of the isolating layer may include exposing the isolating layer to an exposure energy having a predetermined intensity distribution and developing the isolating layer. Forming the openings may also include curing the isolating layer such that openings having a predetermined shape are formed in select portions of the isolating layer extending between the second surface of the isolating layer and the second surfaces of the interconnect pads over which the first surface of the isolating layer is disposed.

Disposing the one or more conductive structures may include disposing a conductive material over second surfaces of the interconnect pads. Disposing the one or more conductive structures may also include forming one or more conductive structures having a predetermined shape from the conductive material. The conductive structures are electrically coupled to second surfaces of the interconnect pads and at least a portion of the conductive structures may extend a predetermined distance above the second surface of the isolating layer. Disposing the one or more conductive structures may additionally include coining one or more portions of the conductive structures which are distal to the second surfaces of the interconnect pads.

Providing the one or more pad interconnects having a pad portion and an interconnect portion may include applying an adhesive layer having first and second opposing surfaces. The first surface of the adhesive layer may be disposed over at least select portions of the second surface of the isolating layer and surfaces of the openings formed in the isolating layer extending from the second surface of the isolating layer to second surfaces of the interconnect pads. Providing the one or more pad interconnects having a pad portion and an interconnect portion may also include applying a conductive layer having first and second opposing surfaces. The first surface of the conductive layer may be disposed over the second surface of the adhesive layer. Providing the one or more pad interconnects having a pad portion and an interconnect portion may additionally include removing select portions of the conductive layer to form one or more pad interconnects having a pad portion and an interconnect portion. The pad portion of each one of the pad interconnects may have a surface disposed over select portions of the second surface of the isolating layer. The interconnect portion of each one of the pad interconnects may extend from the pad portion to second surfaces of the interconnect pads and has a surface disposed over select edges of the openings formed in the isolating layer.

Disposing the one or more conductive structures may include applying a photo resist layer having first and second opposing surfaces. The first surface of the photo resist layer may be disposed over the second surface of the conductive layer. Disposing the one or more conductive structures may also include exposing the photo resist layer to an exposure energy having a predetermined intensity distribution such that openings having a predetermined shape are formed in select portions of the photo resist layer extending between the second surface of the photo resist layer and the second surfaces of the interconnect pads. Disposing the one or more conductive structures may additionally include disposing a conductive material in the openings of the photo resist layer over second surfaces of the interconnect pads. Disposing the one or more conductive structures may further include forming one or more conductive structures having a predetermined shape from the conductive material. The conductive structures may be electrically coupled to second surfaces of the interconnect pads and at least a portion of the conductive structures may extend a predetermined distance above the second surface of the isolating layer. Disposing the one or more conductive structures may also include removing remaining portions of the photo resist layer from the second surface of the conductive layer.

In another aspect of the concepts described herein, a semiconductor structure includes a substrate having first and second opposing surfaces and a plurality of electrical connections extending between the first and second surfaces. The semiconductor structure also includes one or more interconnect pads having first and second opposing surfaces and one or more sides. The first surface of each one of the interconnect pads is disposed over or beneath select portions of at least the second surface of the substrate and is electrically coupled to select ones of the plurality of electrical connections. The semiconductor structure additionally includes an isolating layer having first and second opposing surfaces and openings formed in select portions of the isolating layer extending between the second surface of the isolating layer and the second surfaces of the interconnect pads. The first surface of the isolating layer is disposed over the second surface of the substrate and the second surfaces and one or more sides of the interconnect pads and the openings formed in the isolating layer have a predetermined shape.

The semiconductor structure further includes one or more pad interconnects having a pad portion and an interconnect portion. The pad portion of each one of the pad interconnects has a surface disposed over select portions of the second surface of the isolating layer. Additionally, the interconnect portion of each one of the pad interconnects extends from the pad portion to the second surfaces of the interconnect pads and has a surface disposed over select edges of the openings formed in the isolating layer. The semiconductor structure additionally includes one or more conductive structures disposed in each of the openings formed in the isolating layer and electrically coupled to second surfaces of the interconnect pads to form an interconnect for electrically and mechanically coupling the semiconductor structure to other semiconductor structures and devices.

The semiconductor structure may include one or more of the following features individually or in combination with other features. The conductive structures may be provided from one or more fusible conductive materials. Each of the conductive structures may have a substantially spherical shape. The conductive structures may have a diameter of at least about eighteen micrometers (μm). At least a portion of the conductive structures may be substantially coined. At least a portion of the conductive structures may extend a predetermined distance above the second surface of the isolating layer. The predetermined distance may be between about sixteen μm and about eighteen μm. The conductive structures may be provided having first and second opposing surfaces with first surfaces of first ones of the conductive structures electrically coupled to second surfaces of the interconnect pads and first surfaces of the first ones of the conductive structures having a surface area that is larger than a surface area of second surfaces of the first ones of the conductive structures.

The semiconductor structure may also include one or more of the following features individual or in combination with other features. A conductive layer may be disposed over at least select portions of the second surface of the isolating layer and surfaces of the openings in the isolating layer extending from the second surface of the isolating layer to first surfaces of the interconnect pads over which the first surface of the isolating later is disposed. The conductive layer may be electrically coupled to the second surfaces of the interconnect pads. A space between about one urn and about one-hundred um may exist between edges of the openings formed in the isolating layer and edges of the conductive structures. Each of the interconnect pads may have a separate corresponding opening in the isolating layer.

The semiconductor structure may also include one or more of the following features individual or in combination with other features. The substrate may be a multi-layer substrate. The semiconductor structure may be provided as part of a tunable filter and the substrate may include at least three layers. A first one of the layers may include a first resonator circuit, a second one of the layers may include a second resonator circuit, and a third one of the layers may include a third resonator circuit. Additionally, the first, second and third resonator circuits may be combinable to provide a filter circuit having a multi-octave response characteristic.

In yet another aspect of the concepts described herein, a method for fabricating a semiconductor device comprising at least two semiconductor structures, where each of the at least two semiconductor structures has first and second opposing surfaces and a plurality of electrical connections extending between the first and second surfaces of the semiconductor structures, includes providing a first semiconductor structure. The first semiconductor structure has an isolating layer and one or more interconnect pads. The interconnect pads have first and second opposing surfaces and one or more sides. The first surface of each one of the interconnect pads is disposed over or beneath select portions of at least the second surface of the first semiconductor structure and is electrically coupled to select ones of the plurality of electrical connections of the first semiconductor structure.

The isolating layer has first and second opposing surfaces and openings formed in select portions of the isolating layer extending between the second surface of the Isolating layer and the second surfaces of the interconnect pads over which the first surface of the isolating layer is disposed. The first surface of the isolating layer is disposed over the second surface of the first semiconductor structure and the second surfaces and one or more sides of the interconnect pads. The openings formed in the Isolating layer have a predetermined shape.

The method also includes providing a second semiconductor structure. The second semiconductor structure has one or more fusible coupling structures that are provided as at least one of a solder be and self-aligned contact pad. The fusible coupling structures have at least first and second opposing surfaces, where first surfaces of the fusible coupling structures are disposed over at least the second surface of the second semiconductor structure and are electrically coupled to selected ones of the plurality of electrical connections. The method additionally includes providing one or more pad interconnects having a pad portion and an interconnect portion. The pad portion of each one of the pad interconnects has a surface disposed over select portions of the second surface of the isolating layer of the first semiconductor structure. Additionally, the interconnect portion of each one of the pad interconnects extends from the pad portion to second surfaces of the interconnect pads of the first semiconductor structure and has a surface disposed over select edges of the openings formed in the isolating layer of the first semiconductor structure.

The method further includes disposing one or more conductive structures in each of the openings formed in the isolating layer of the first semiconductor structure. The conductive structures are electrically coupled to second surfaces of the interconnect pads to form an interconnect for electrically and mechanically coupling the first semiconductor structure to at least the second semiconductor structure.

The method also includes aligning the second surface of the second semiconductor structure with the second surface of the first semiconductor structure such that the second surfaces of the first and second semiconductor structures are substantially parallel to each other and spaced apart from each other by a predetermined separation distance. The method also includes decreasing the predetermined separation distance from a first distance to a second, lower distance such that the fusible coupling structures of the second semiconductor structure and the conductive structures of the first semiconductor structure are substantially in contact with each other. The method additionally includes exposing at least one of the fusible coupling structures of the second semiconductor structure and the conductive structures of the first semiconductor structure to an exposure energy having a predetermined intensity distribution for a predetermined time period to form an electrical connection between the first semiconductor structure and the second semiconductor structure.

The method may include one or more of the following features either individually or in combination with other features. Disposing the one or more conductive structures may include disposing a select number of conductive structures in each of the openings formed in the isolating layer of the first semiconductor structure. One or more points on a surface of first ones of the conductive structures may be electrically coupled to second surfaces of the interconnect pads and at least a portion of last ones of the conductive structures may extend a predetermined distance above the second surface of the isolating layer. The select number of conductive structures may be based upon a desired separation distance between second surfaces of the first and second semiconductor structures.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 2 is a block diagram of an example semiconductor structure including an example conductive structure;

FIG. 2A is a block diagram of an example semiconductor structure similar to the semiconductor structure of FIG. 2, for example, the example semiconductor structure including another example conductive structure;

FIG. 3 is a block diagram of another example semiconductor structure including an example conductive structure;

FIG. 3A is a block diagram of an example semiconductor structure similar to the semiconductor structure of FIG. 3, for example, the example semiconductor structure including another example conductive structure;

FIG. 4 is a block diagram of another example semiconductor structure including an example conductive structure;

FIG. 4A is a block diagram of an example semiconductor structure similar to the semiconductor structure of FIG. 4, for example, the example semiconductor structure including another example conductive structure;

FIG. 7 is a block diagram of example semiconductor structures;

FIG. 7A is a block diagram of an example semiconductor device including the semiconductor structures of FIG. 7, for example;

DETAILED DESCRIPTION

Figure 1:
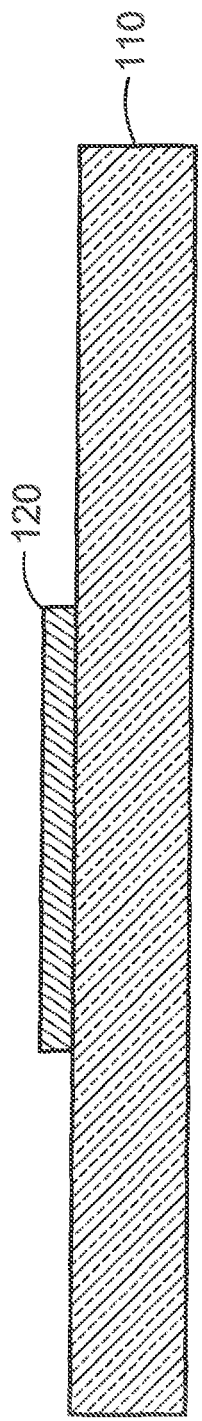
FIGS. 1-1E are example semiconductor structures as may be provided in an example method for fabricating a semiconductor structure in accordance with an embodiment.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding pails throughout the various views.

Definitions

For convenience, certain introductory concepts and terms used in the specification are collected here.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit. The "controller circuit" described herein may be provided as a "processor."

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary MOS (CMOS) devices, or a number of active or passive integrated circuit semiconductor devices.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "fine pitch" is used to describe a pitch associated with one or more interconnects used to connect one or more semiconductor structures, the interconnects possessing a width ranging from about 0.2 mils to about 10.0 mil and spaced apart from each other (at the nearest point of edges of adjacent conductor features) within a range of about 0.2 mils to about 20.0 mil (as defined herein, a mil is equal to 0.001 inch).

As used herein, the term "high speed" is used to describe signal speed capabilities of signals having a frequency ranging from about 1.0 Gigabits per Second (GPS) to at least about 100.0 GPS.

As used herein, the term "interposer" is used to describe a structure capable of electrically coupling two or more semiconductor structures (e.g., electrical conductors on two opposing circuitized substrates). Such an interposer may include at least one dielectric layer and at least one connecting structure (e.g., spring connectors) positioned therein for connecting respective pairs of conductors of the opposing substrates. As defined herein, the interposer may further include at least two external conductive circuit layers and possibly one or more internal conductive circuit layers. Examples of dielectric materials include low temperature co-fired ceramic (LTCC), ceramic (alumina), fiberglass-reinforced epoxy resins (some referred to as FR4 dielectric materials in the art), such reinforced resins having inorganic particles (e.g., silica) therein as well as epoxy resins including inorganic particles (e.g., silica) for the purpose of controlling the coefficient of thermal expansion (CTE) of the dielectric material, polytetrafluoroethylene, including polytetrafluoroethylene filled with inorganic particles (e.g., silica) as a means of controlling the coefficient of thermal expansion of the dielectric material, polyimides fiberglass-reinforced polyimides, polyamides, cyanate resins, polyphenylene ether resins, fiberglass-reinforced polyphenylene ether resins, fiberglass-reinforced polyphenylene ether resins filled with inorganic particles (e.g., silica), aramid fiber-reinforced resins, liquid crystal polymers, photo-imagable materials, and other like materials. If the dielectric material for the interposer is of photo-imagable material, this material may be photo-imaged (or photo-patterned), and developed to reveal the desired pattern of openings. The dielectric material may be curtain-coated, spin-coated or screen-applied, or it may be supplied as dry film.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules corning in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "open via" is used to describe an electrically conductive structure formed within or near a surface of a circuitized substrate. It can be used in double or multilayered substrates to provide conductive interconnections between circuitry on a surface of the substrate and one or more circuit layers in the substrate.

As used herein, the term "electronic device" is used to describe an integrated circuit (IC) device (e.g., a semiconductor chip).

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or a reflow process.

As used herein, the term "micro pillar/bump/ball" is used to describe a structure grown from a metal surface or disposed on a metal surface in such a way that that a peak interconnects height of the structure is equal or less than z-joint height. The structure may include a single metal or multiple metals deposited by layer after layer metallization. The metal surface can include a single micro pillar or multiple micro pillars. Micro pillars may achieve physical, chemical, mechanical and/or metallic bonding during assembly process.

As used herein, the term "information handling system" is used to describe any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include smart phones, personal computers and larger processors such as computer servers and mainframes. Such products are well known in the art and are also known to include electronic packages including PCBs and chip carriers and other forms of circuitized substrates as part thereof, some including several such packages depending on the operational requirements thereof.

While semiconductor structures including a single substrate or substrates having a single layer are described in several examples below, a single substrate and substrates having a single layer are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than a single substrate or substrates having a single layer.

Additionally, it should, of course, be appreciated that elements shown in the figures are not necessarily drawn to scale. For example, the dimensions of some elements may be exaggerated relative to other elements for clarity. Further, where considered appropriate, same or similar reference designators have been repeated among the figures to indicate corresponding or analogous elements.

Figure 1A:
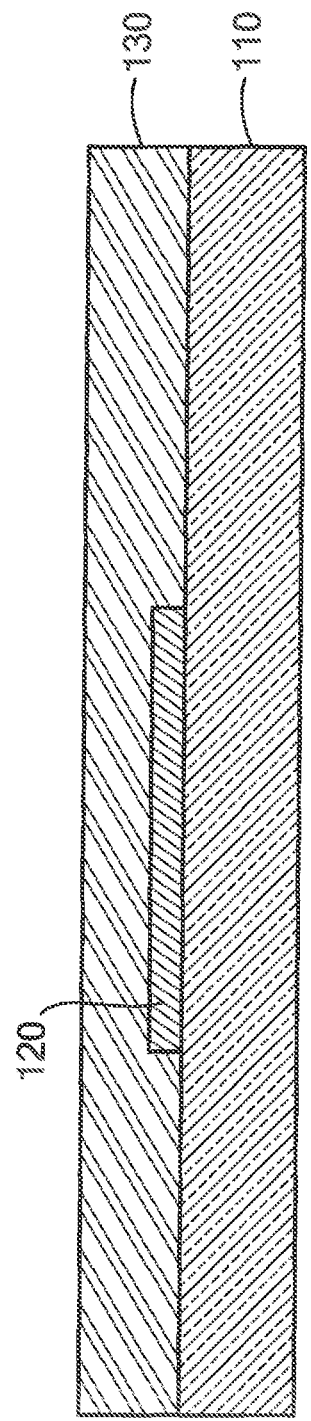
Figure 1B:
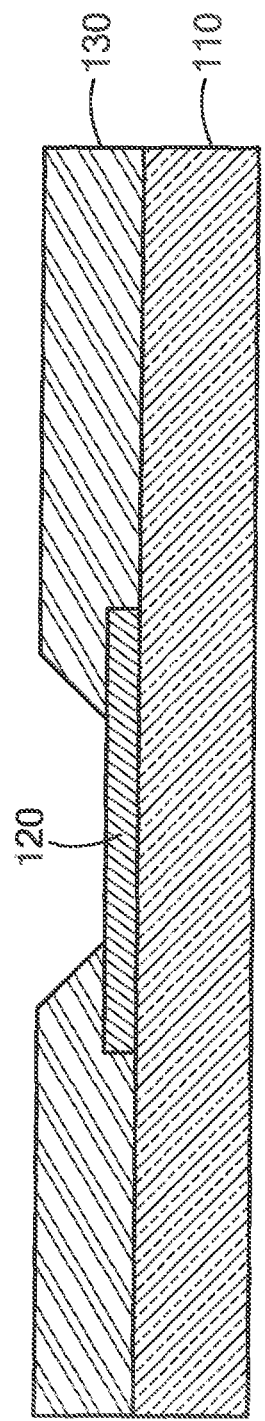
Figure 1C:
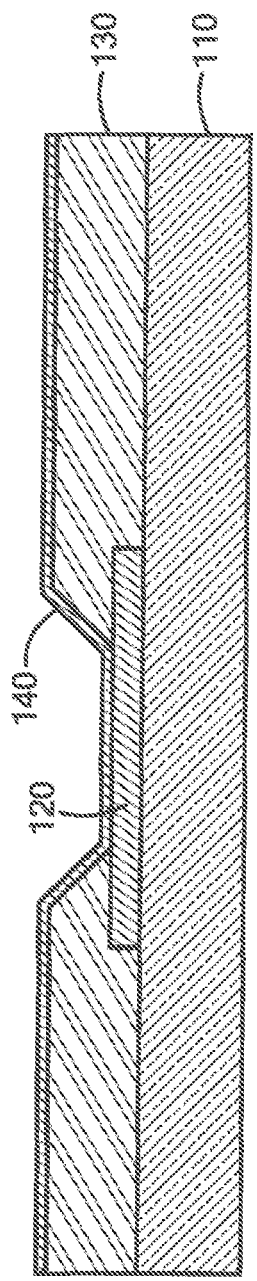
Figure 1D:
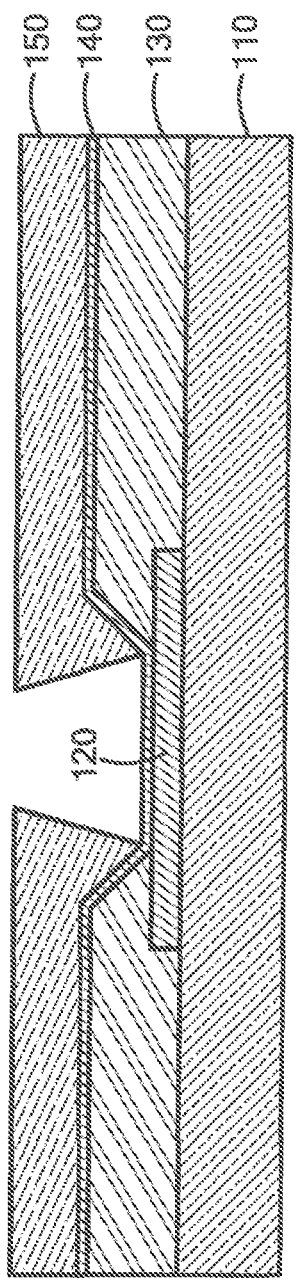
Figure 1E:
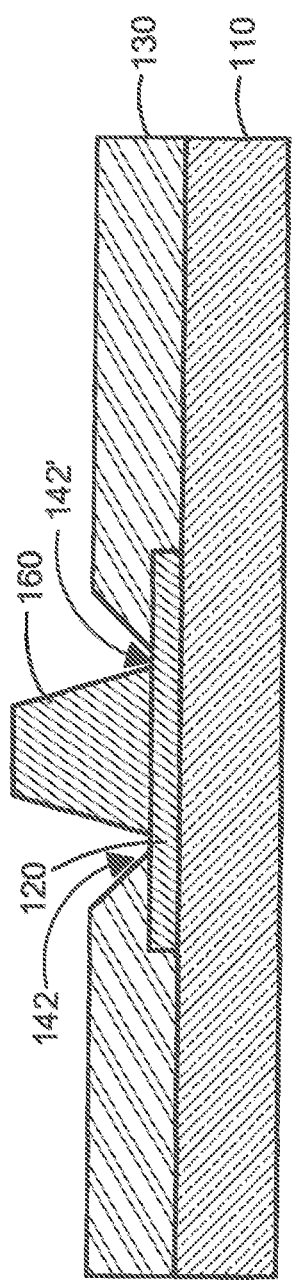

Referring now to FIGS. 1-1E, example semiconductor structures as may be provided in an example method for fabricating a semiconductor structure in accordance with the concepts, systems, circuits and techniques sought to be protected herein are shown. While FIGS. 1-1E are illustrated to comprise a sequence of processes, the example method is not limited to performing the illustrated processes in the sequence shown.

Referring now to FIG. 1, an example semiconductor structure (e.g., a wafer or die) includes a substrate (e.g. a single or multilayer substrate) 110 and an interconnect pad 120 (e.g., a solderable metal pad). Substrate 110 has first and second opposing surfaces and a plurality of electrical connections (e.g., vias) extending between the first and second surfaces. The electrical connections may, for example, be made by drilling holes through the substrate 110 in appropriate locations and plating the inside of the holes with a conducting material (e.g., copper). Interconnect pad 120, which has first and second opposing surfaces and a plurality of sides, is provided in a pattern or shape which promotes scalability of the semiconductor structure (e.g., for coupling the semiconductor structure to other semiconductor structures or devices). A first surface of interconnect pad 120 is disposed over or beneath (e.g., attached or otherwise coupled to) select portions of at least the second surface of substrate 110 using techniques well known to those of ordinary skill in the art. The first surface of interconnect pad 120 is also electrically coupled to select ones of the plurality of electrical connections in substrate 110. The electrical coupling may, for example, occur through bond wires or via contacts spaced between the first surface of interconnect pad 120 and the electrical connections in a region below the interconnect pad 120.

The interconnect pad 120, which may have a substantially circular, rectangular or square shape, for example, may be formed of a single layer of material, or multiple layers of material. Those of ordinary skill in the art will understand how to select the shape and size of pad 120 for a particular application (e.g., based on pitch and assembly risk sites). Example electrically conductive materials for interconnect pad 120 include, but are not limited to: copper, aluminum, gold/nickel/Cu, gold/platinum/Titanium/Al and/or other suitable electrically conductive materials.

In some embodiments, interconnect pad 120 is embedded in the second surface of the substrate 110, with the second surface of interconnect pad 120 extending a predetermined distance above the second surface of the substrate 110. In some embodiments, this predetermined distance is zero.

In the example embodiment shown, the substrate 110 is provided as a single layer structure. In other embodiments, however, the substrate 110 may be provided as a multilayer structure (e.g. a double layer structure or as a structure having three or more layers).

Referring now to FIG. 1A, an example semiconductor structure includes a substrate 110, a interconnect pad 120 and an isolating layer 130. The isolating layer 130 may include a photoimageable polymer having first and second opposing surfaces. A first surface of the isolating layer 130 is disposed over or otherwise applied or coupled to the second surface of substrate 110 and the second surface and plurality of sides of interconnect pad 120 (e.g., through deposition or "printing"). In embodiments where the isolating layer 130 is provided from a semisolid material, for example, isolating layer 130 may additionally be "soft baked" over substrate 110 and interconnect pad 120 to form a substantially solid isolating layer. The isolating layer 130 may also include a photodefineable polymer which may be used as a dielectric bridge for crossover of circuits within a same layer of the substrate 110. A dielectric bridge may also be created by selective deposition of a dielectric material (e.g., nanopourous silica, silicon oxyflouride) using a physical vapor deposition (PVD) and/or a chemical vapor deposition (CVD) process.

Referring now to FIG. 1B, an example semiconductor structure includes a substrate 110, a interconnect pad 120 and an isolating layer 130 similar to the semiconductor structure shown in FIG. 1A. Here, however, the isolating layer 130 has an opening formed or otherwise provided in a select portion of the isolating later 130. The opening, which may be provided to accommodate one or more conductive structures (e.g., conductive structure 160, as will be discussed), extends between the second surface of isolating layer 130 and the second surface of interconnect pad 120 (and, thus, the first surface of isolating layer 130).

In some embodiments, the openings in isolating layer 130 may be formed (or created) by an "additive" process or a "subtractive" process. In the additive process, the isolating layer 130 is applied, or added, onto the second surface of substrate 110 and the second surface and sides of interconnect pad 120 in a desired pattern (i.e., with the opening formed in the isolating layer). In the subtractive process, the isolating layer 130 is first applied, and then the opening is etched away, or subtracted, from the isolating layer 130. The opening may, for example, be drilled, cut or grinded to expose at least a potion of interconnect pad 120 and at least a portion of the one or more conductive structures (e.g., conductive structures 160, as will be discussed).

Additionally, in some embodiments, the openings in isolation layer 130 may be formed by exposing, developing, and/or curing the isolating layer 130 in one or more ovens (e.g., heat treatment ovens, curing ovens and the like).

Referring now to FIG. 1C, an example semiconductor structure includes a substrate 110, a interconnect pad 120, an isolating layer 130 with an opening and a conductive layer 140 having first and send opposing surfaces. The conductive layer 140, is provided from an electrically conductive material (e.g., copper, gold or aluminum) which may be the same as or similar to the material from which interconnect pad 120 is provided. A first surface of the conductive layer 140 is disposed over (e.g., attached or otherwise coupled to) at least a portion of the second surface of the isolating layer 130 and the interconnect pad 120 in some embodiments. The conductive layer 140 may be electrically coupled to at least the second surface of interconnect pad 120. The conductive layer 140 may also be patterned using photo process and/or deposited over at least a portion of the second surface of the isolating layer 130 and the interconnect pad 120 by one or more physical (e.g., sputter) and chemical (e.g., electroless) processes.

In an alternative embodiment, the first surface of the conductive layer 140, which may be provided as a patterned conductive layer, is disposed over an adhesive layer (e.g., an adhesive promoter layer) for coupling the conductive structure 140 to isolating layer 130 and interconnect pad 120. The adhesive layer (not shown) may, for example, be provided having first and second opposing surfaces and be provided from an electrically conductive adhesive material (e.g., adhesive copper). A first surface of the adhesive layer may be disposed over at least select portions of the second surface of the Isolating layer 130 and surfaces of the opening formed in the isolating layer 130 extending from the second surface of the isolating layer to the second surface of the interconnect pad 120 (and, thus, the first surface of isolating layer 130). The adhesive may also be provided on the periphery of the opening in the isolating layer 130. Suitable adhesives of the adhesive layer may include die attach adhesive, adhesive tape or the like.

Referring now to FIG. 1D, an example semiconductor structure includes a substrate 110, a interconnect pad 120 and an isolating layer 130 with an opening. The semiconductor structure also includes a conductive layer 140 and a photo resist layer 150. The photo resist layer 150, which may be provided from a positive photo resist material (e.g., Polymethyl methacrylate (PMMA)) or another polymer that has a property of becoming more soluble when exposed to ultraviolet light, has first and second opposing surfaces. A first surface of the photo resist layer 150 is disposed over the second surface of conductive layer 140. Additionally, an opening having a predetermined shape is formed in select portions of the photo resist layer 150 extending between the second surface of the photo resist layer and the second surface of the interconnect pad 120. The opening may, for example, be formed by exposing the photo resist layer 150 to an exposure energy (e.g., ultraviolet light) having a predetermined intensity distribution and, optionally, developing the photo resist layer 150. The opening may also be formed by grinding select portions of the photo resist layer 150.

Additionally, the opening may be formed by depositing a photo resist layer 160 including a positive photo resist material over the conductive layer 140 (e.g., where the conductive layer 140 is an unpatterned conductive layer having a thickness of less than about one micron), exposing the photo resist layer 150, and developing the photo resist layer 150 such that one or more conductive structures (e.g., conductive structure 160, as will be discussed) may be grown on top of the conductive layer 140 by an electroplating process, for example. One or more portions of the photo resist layer 150 may be stripped and the conductive layer 140 may be etched (e.g., through a flash etch process) to produce the conductive structures. In one aspect, the conductive structures have a thickness that is substantially greater than a thickness of conductive layer 140 such that the conductive layer 140 may be removed during the etch process.

Alternatively, the opening may be formed by depositing a photo resist layer 150 including a negative photo resist material over the conductive layer 140 (e.g., where the conductive layer 140 is a patterned conductive layer), exposing the photo resist layer 150, and developing the photo resist layer 150 such that one or more conductive structures may be grown on top of the conductive layer 140 by a thermal evaporation process, for example. One or more portions of the photo resist layer 150 may be stripped and the conductive structures may be formed on top of the conductive layer 140. In one aspect, the semiconductor structure shown in FIG. 1D is representative a semiconductor structure achieved using such approach. Further, the opening may be formed through a similar process to that which was previously described in embodiments where a photo resist layer 150 including a negative photo resist material is deposited over a conductive layer 140 (e.g., where the conductive layer 140 is an unpatterned conductive layer having a thickness of less than about one micron).

Referring now to FIG. 1E, an example semiconductor structure includes the substrate 110, the interconnect pad 120 and the isolating layer 130 with an opening. The semiconductor structure also includes one or more conductive structures (here, a conductive structure 160). The conductive structure 160 may, for example, be formed by disposing an electrically conductive material (e.g., copper, gold, or aluminum) in the opening in the photo resist layer 150 over the second surface of the interconnect pad 120 and developing the conductive material to form the conductive structure 160. The conductive structure 160 is provided having a predetermined shape (e.g., a substantially spherical, cylindrical, or triangular shape). Conductive structure 160 is electrically coupled to the exposed (or second) surface of the interconnect pad 120. Additionally, in the example embodiment shown, at least a portion of conductive structure 160 extends a predetermined distance above the second surface of the isolating layer 130 (and, in some embodiments, the second surface of the conductive layer 140). Those of ordinary skill in the art will understand how to select the predetermined distance for a particular application (e.g., for finer pitch applications). As one example, the predetermined distance, which is related to the height of conductive structure 160, may compensate for structural misalignment between semiconductor structures, as will be further discussed below in conjunction with FIGS. 10 and 10A, for example.

The photo resist layer 150 is removed (e.g., stripped with a solvent) from the second surface the conductive layer 140 to expose the conductive layer 140. Further, one or more portions of the conductive layer 140 may be removed to expose select portions of the adhesive layer (not shown) or isolating layer 130, as illustrated in the example embodiment shown. Select portions of the conductive layer 140 may also be removed to form one or more pad interconnects (not shown), as will be described further in conjunction with the figures below. Conductive structure 160 and interconnect pad 120 form an interconnect for electrically and mechanically coupling the semiconductor structure to other semiconductor structures and devices (e.g., to form a multi-layer semiconductor structure or device, as will be discussed). Additionally, components on surfaces of the semiconductor structure may be electrically coupled to semiconductor structure through conductive structure 160 and interconnect pad 120.

In some embodiments, instead of forming the conductive structure 160 from the conductive material over the second surface of the interconnect pad 120, the conductive structure 160 may be formed in a separate process with the conductive structure 160 subsequently disposed over and electrically coupled to the interconnect pad 120 through a reflow process, for example.

Additionally, in some embodiments, a space (or cavity) between about one micrometer (μm) and about one-hundred μm exist between edges of the openings formed in the isolating layer 130 and edges of the conductive structure 160 disposed in the openings. The space may be provided by cavities 142, 142', as illustrated. The space maybe controlled by a photo etch process (e.g., by creating an appropriate resist opening). The cavities 142, 142' may, for example, store solder (i.e., excess solder) produced when coupling the semiconductor structure of FIG. 1E to other semiconductor structures or devices through a reflow process (e.g., to further reduce risk of an electrical short). Additionally, the cavities 142, 142' may provide for conductive structure 160 being implemented as, or being the same as or similar to, an open via or a partially open via.

Additionally, in some embodiments, one or more of the semiconductor structures of FIGS. 1-1E discussed above and one or more of the semiconductor structures or devices of FIGS. 2-12B discussed below may include or be provided as part of a system such as a telecommunication system (e.g., in a handset or base station) or an information technology system or a circuit such as a filter circuit (e.g., a tunable radio-frequency (RF) filer circuit), for example, with a substrate (e.g., substrate 110) of the semiconductor structures or devices including a plurality of layers, in implementing a filter circuit, for example, a first one of the layers of the substrate may include a first resonator circuit, a second one of the layers may include a second resonator circuit, a third one of the layers may include a third resonator circuit and so on. The resonator circuits may, for example, be combinable to provide a filter circuit having a multi-octave response characteristic.

Further, in some embodiments, one or more of the semiconductor structures of FIGS. 1-1E discussed above and one or more of the semiconductor structures or devices of FIGS. 2-12B discussed below may include or be provided as part of a multi-layer semiconductor structure, for example, such as the types described in any of U.S. Pat. Nos. 7,064,055; 7,067,909; and 7,307,003 all of which are assigned to the assignee of the present application and incorporated herein by reference in their entireties.

Same or similar techniques as those described above can be used to convert conventional semiconductor structures into semiconductor structures having a finer pitch. For example, a conventional semiconductor structure can be converted (or integrated) into a semiconductor structure having a finer pitch by reducing size of interconnect pads in the semiconductor structure, reducing spacing between interconnect pads in the semiconductor structure and disposing one or more conductive structures (e.g., conductive structure 160) over interconnect pads in the semiconductor structure. Size and shape of the one or more conductive structures may determine size of interconnects. For example, when the conductive structures are electrically coupled to a solder surface during reflow and or melting, solder melt may overcoat the conductive structures to create a finer pitch structure, as will be described further below.

Additionally, a conventional semiconductor structure can be converted (or integrated) into a semiconductor structure having a finer pitch by replacing the interconnect pads in the semiconductor structure with the interconnect pads and structures disclosed herein. Further, it should be appreciated that a pitch of a semiconductor structure (or device) including two or more semiconductor structures can be reduced through use of at least one semiconductor structure having a reduced interconnect pitch as disclosed herein in the semiconductor structure (or device) including the two or more semiconductor structures.

Further aspects of the concepts, systems, circuits and techniques sought to be protected herein, with particular emphasis on conductive structures and semiconductor structures and devices fabricated using the conductive structures, ere described in conjunction with the figures below.

Referring now to FIG. 2, an example semiconductor structure in accordance with the concepts, systems, circuits and techniques sought to be protected herein includes a substrate 210, an interconnect pad 220, an isolating layer 230, which may be the same as or similar to substrate 110, interconnect pad 120 and isolating layer 130 of FIGS. 1-1E, for example. The semiconductor structure also includes a conductive structure 260 and a plurality of pad interconnects (here, first and second pad interconnects 238, 238'). The isolating layer 230, which may be provided from a polymer material (e.g., a resin polymer such as polyimide) and may be provided as a passivation layer, for example, has first and second opposing surfaces similar to isolating layer 130 of FIG. 1.

First and second pad interconnects 238, 238' include pad portions 240, 240' and interconnect portions 241, 241', respectively. Dimensions of each of the pad portions 240, 240' and interconnect portions 241, 241' may be selected based on a desired spread of solder within cavities (e.g., cavities 142, 142', as will be discussed) formed in the semiconductor structure. Such solder may, for example, be produced during a process for coupling the semiconductor structure of FIG. 2 with another semiconductor structure. Additionally, dimensions of the pad portions 240, 240' and interconnect portions 241, 241' may be selected based on a desired interconnect height and/or width (e.g., to provide for a desired spreading of solder and produce reliable structure). The pad portions 240, 240' of each one of the pad interconnects 238, 238' has a surface disposed over select portions of the second surface of the isolating layer 230. Additionally, the interconnect portions 241, 241' portions of each one of the pad interconnects extend from the pad portions 240, 240' to the second surface of the interconnect pad 220. Interconnect portions 241, 241' also have a surface disposed over select edges of an opening formed in a select portion of the isolating layer 230 extending between the second surface of the isolating layer 230 and a second surface of the interconnect pad 220 (and, thus, the first surface of isolating layer 230).

The conductive structure 260, which may be provided from one or more fusible conductive materials (e.g., solder, conductive glue) or have one or more surfaces (or one or more portions of a surface) coated with fusible conductive materials (e.g., a solderable surface finish), for example, is disposed in the opening formed in the isolating layer 130. Conductive structure 260 is electrically coupled to the second surface of the interconnect pad 220 to form an interconnect for electrically and mechanically coupling the semiconductor structure to one or more other semiconductor structures or devices.

One or more cavities (here, first and second cavities 242, 242'), similar to cavities 142, 142' (FIG. 1), exist between edges of the interconnect portions 241, 241' of the pad interconnects 238, 238' and edges of the conductive structure 260. Each of the cavities 242, 242' may be provided having a predetermined shape and may provide for conductive structure 260 being implemented as, or being the same as or similar to, an open via or a partially open via. Alternatively, cavities 242, 242' can be considered as an open via or partially open via. As one example, conductive structure 260 may be disposed in an open via to create cavities 242, 242'. The predetermined shape of each of the cavities 242, 242', in addition to size and shape of the conductive structure 260, may be selected based on a desired space for storing solder in the cavities 242, 242'.

Figure 2B:
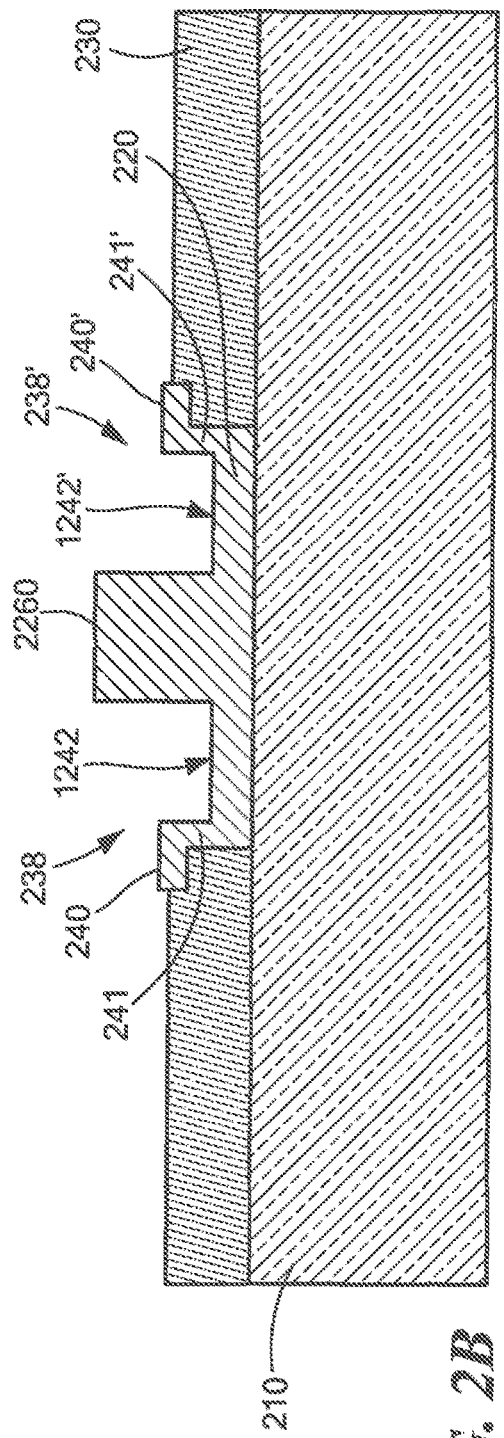
FIG. 2B is a block diagram of an example semiconductor structure similar to the semiconductor structure of FIG. 2, for example, the example semiconductor structure including another example conductive structure.
Figure 2C:
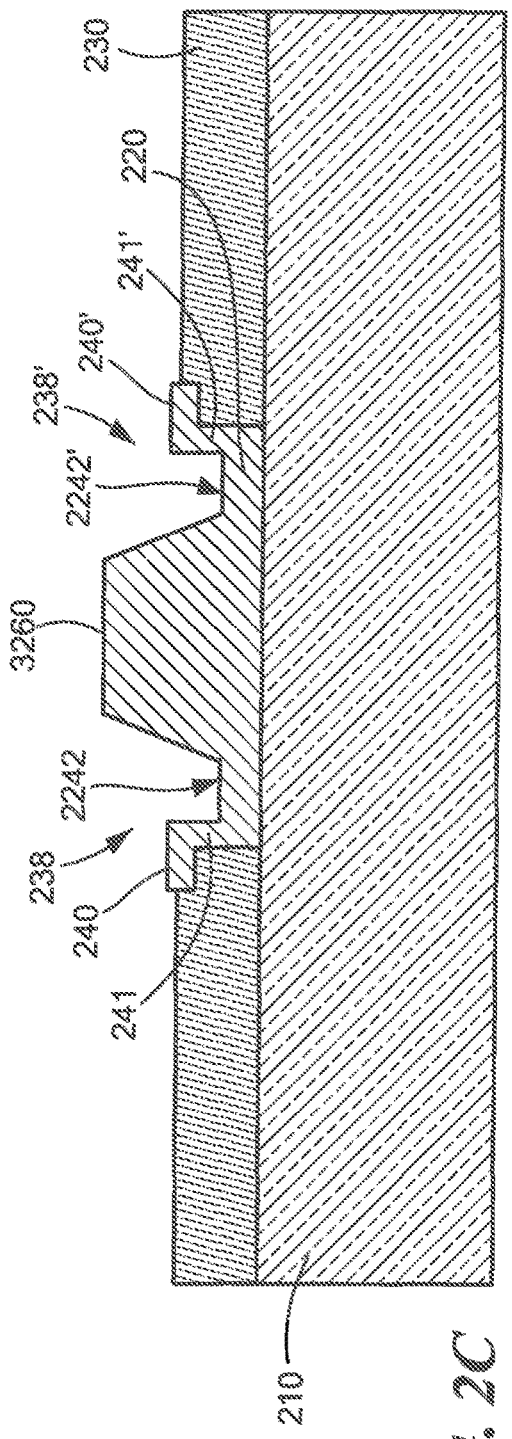
FIG. 2C is a block diagram of an example semiconductor structure similar to the semiconductor structure of FIG. 2, for example, the example semiconductor structure including another example conductive structure.

The conductive structure 260 has a substantially spherical shape in the example embodiment shown. In other embodiments, however, the conductive structure 260 may be provided as a ball, stud, or bump and have a shape that is the same as or similar to a cube, cylinder, cone, rectangular prism, cube, triangular prism, trapezoidal prism, octagonal prism, triangular pyramid, square pyramid or the like depending upon the fabrication process used for producing the conductive structure 260, for example, some of which shapes are shown in FIGS. 2A-2C. At least a portion of conductive structure 260 extends a predetermined distance D above the second surface of the isolating layer 230 in the example embodiment shown. In some embodiments, the predetermined distance is between about sixteen micrometers (µm) and about eighteen µm. In other embodiments, however, the predetermined distance may be less than about sixteen µm or greater than about eighteen µm. Those of ordinary skill in the art, after reading the disclosure provided herein, will appreciate how to select an appropriate distance for a selected application. Some factors to consider in making such a selection include, but are not limited to interconnect shape and height, and solder wettable nature of surfaces. The conductive structure 260 may also have dimensions that are greater than the openings in the isolating layer 230 and/or dimensions of the interconnect pad 220. Additionally, one or more conductive structures may be stacked on top of each other, as shown in FIG. 11A, for example.

In some embodiments, the interconnect pad 220 is provided having dimensions (e.g., length, width, height) that are less than dimensions of interconnect pads in conventional semiconductor structures and a reduced spacing between other interconnect pads (not shown) in the semiconductor structure in comparison to conventional semiconductor structures (e.g., providing for more interconnect pads and interconnects in the semiconductor structure in comparison to conventional semiconductor structures). Additionally, interconnect pad 220 can have a single conductive structure 1260 disposed thereon or multiple conductive structures (e.g., 260, 1260) thereon, with each conductive structure having a same or different size and height.

Referring now to FIG. 2A, an example semiconductor structure similar to the semiconductor structure of FIG. 2 is shown. Here, however, the semiconductor structure includes a conductive structure 1260. Conductive structure 1260, similar to conductive structure 260, has a substantially spherical shape. Unlike conductive structure 260, however, the conductive structure 1260 has a portion (e.g., a portion distal to the second surface of interconnect pad 220) that is substantially coined (or flat). The portion that is substantially coined may, for example, be used to keep the conductive structure 1260 height uniform before bonding.

Referring now to FIG. 2B, another example semiconductor structure includes a conductive structure 2260. As illustrated, conductive structure 2260 has an example shape that is the same as or similar to a cube and at least first and second opposing surfaces, with a first one of the surfaces disposed over the second surface of the interconnect pad 220. The semiconductor structure also includes cavities 1242, 1242', which may have a shape that is the same as or different from cavities 242, 242'.

Referring now to FIG. 2C, another example semiconductor structure includes a conductive structure 3260. As illustrated, conductive structure 2260 has an example shape that is the same as or similar to a trapezoidal prism. Conductive structure 2260, which has at least first and second opposing surfaces with a first one of the surfaces disposed over the second surface of interconnect pad 220, has a first surface with a surface area that is larger than a surface area of a second surface of conductive structure 2260. The semiconductor structure also includes cavities 2242, 2242', which may have a shape that is the same as or different from cavities 242, 242'.

Referring now to FIG. 3, in which like elements of FIG. 2 are provided having like reference designations, a semiconductor structure includes a substrate 210, an interconnect pad 220 and a conductive structure 260. The semiconductor structure, which may be representative of a semiconductor structure without an open via, also includes an isolating layer 330. Similar to isolating layer 230 of FIG. 2, isolating layer 330 may be provided from a polymer material in some embodiments. In the example embodiment shown, however, the isolating layer 330 is provided as a solder mask. Isolating layer 330 may, for example, protect the plurality of electrical connections between the first and second surfaces of the substrate 210 from oxidation and prevent solder snorting between interconnect pad 220 and other interconnect pads (not shown) of the semiconductor structure in embodiments where the semiconductor structure includes more than one isolating pad. The semiconductor structure also cavities 342, 342'.

Referring now to FIG. 3A, an example semiconductor structure similar to the semiconductor shown in FIG. 3 includes an example conductive structure 1260 similar to the conductive structure of the semiconductor structure shown in FIG. 2A, for example.

Figure 3B:
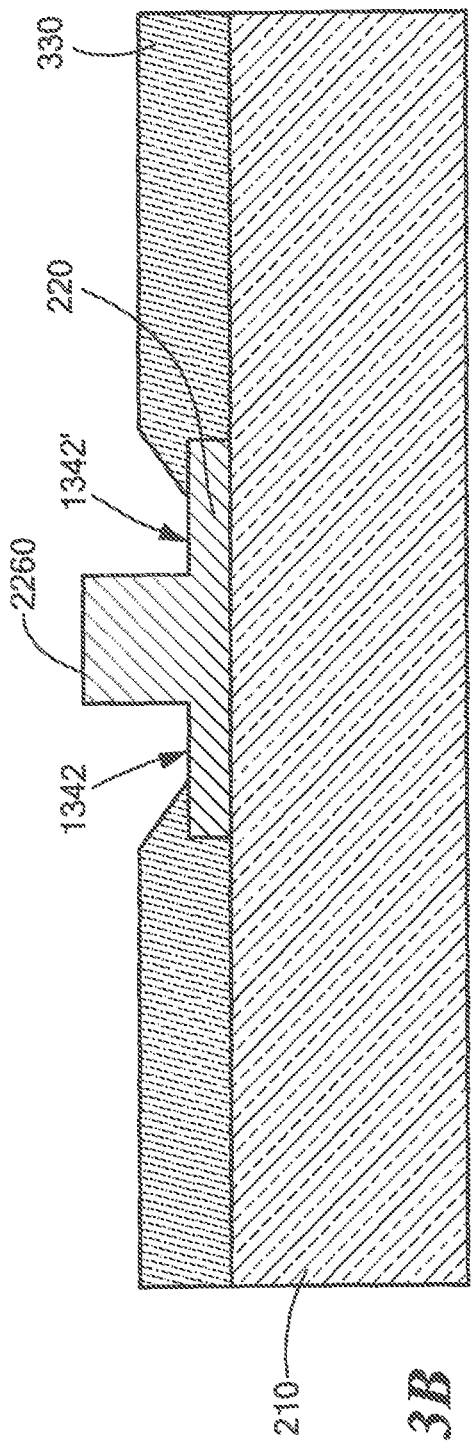
FIG. 3B is a block diagram of an example semiconductor structure similar to the semiconductor structure of FIG. 3, for example, the example semiconductor structure including another example conductive structure.

Referring now to FIG. 3B, an example semiconductor structure similar to the semiconductor shown in FIG. 3 includes an example conductive structure 2260 similar to the conductive structure of the semiconductor structure shown in FIG. 2B, for example. The semiconductor structure includes cavities 1342, 1342', which may have a shape that is the same as or different from cavities 342, 342'.

Figure 3C:
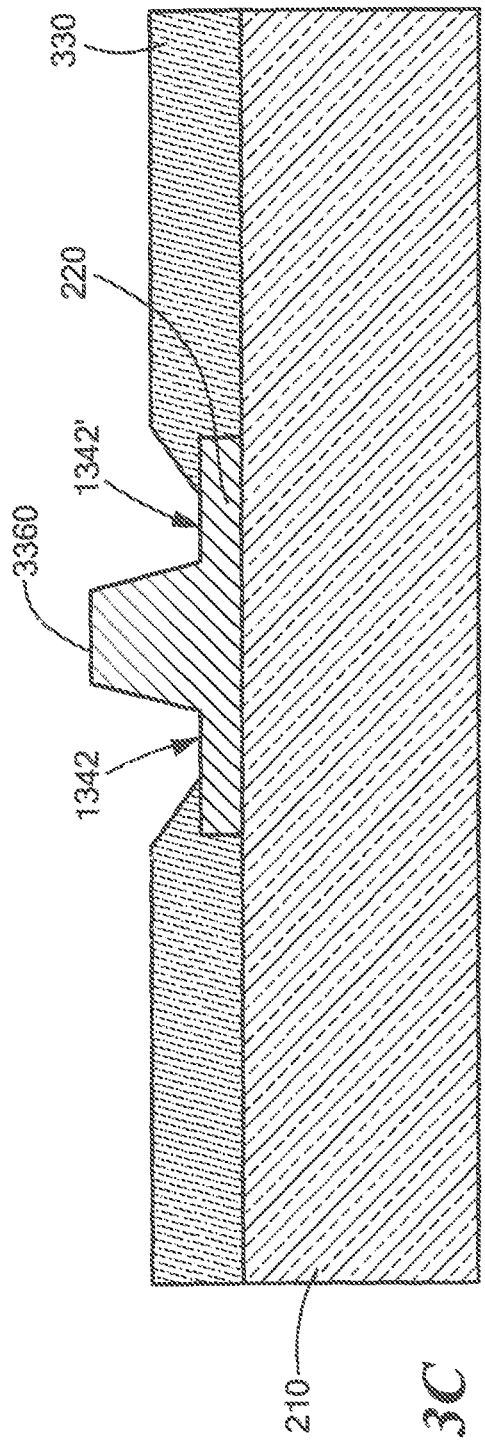
FIG. 3C is a block diagram of an example semiconductor structure similar to the semiconductor structure of FIG. 3, for example, the example semiconductor structure including another example conductive structure.

Referring now to FIG. 3C, an example semiconductor structure similar to the semiconductor shown in FIG. 3 includes an example conductive structure 3360 similar to the conductive structure of the semiconductor structure shown in FIG. 2C, for example.

Referring now to FIG. 4, in which like elements of FIG. 3 are provided having like reference designations, a semiconductor structure includes a substrate 210, an interconnect pad 220 and a conductive structure 260. The semiconductor structure also includes a conductive material 470 disposed on an edge of interconnect pad 220. The conductive material 470, which may include a "low" surface energy metal (e.g., Nickel (Ni), Platinum (Pt), Palladium (Pd)) and/Cr a barrier metal (e.g., Ni or Pd) surface finish, may be provided about a perimeter of the interconnect pad 220, for example, and substantially surround the conductive structure 260. In conductive material 470 may also be provided as part of the interconnect pad 220 (e.g., with the low surface energy metal exposed at edges of the interconnect pad 220). In some embodiments, the conductive structure 260 may have a diameter of at least about eighteen micrometers (µm). The semiconductor structure shown in FIG. 4 is an example of a semiconductor structure where it is possible to reduce or eliminate a need for an isolating layer (e.g., and, thus, simplifying assembly and packaging construction). The semiconductor structure includes cavities 442, 442'.

Referring now to FIG. 4A, an example semiconductor structure similar to the semiconductor shown in FIG. 4 includes an example conductive structure 1260 similar to the conductive structure of the semiconductor structure shown in FIG. 3A, for example. Edges of the interconnect pad 220 have a low surface energy metal (e.g., as may be provided by a conductive material 1470 similar to conductive material 470) which helps to prevent solder flow beyond the interconnect pad 220 to substantially reduce or eliminate electrical shorts.

Figure 4B:
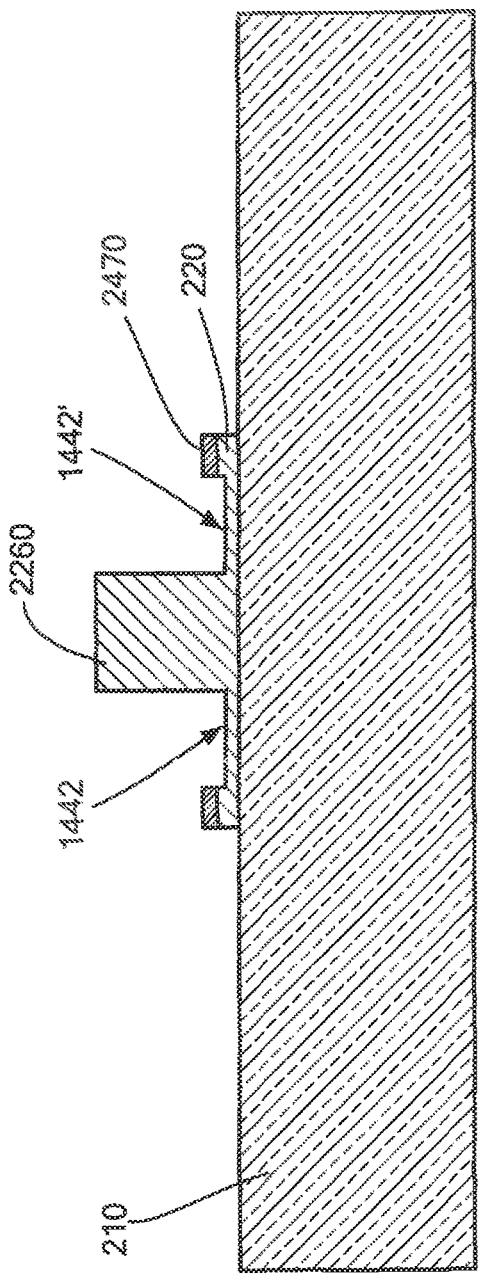
FIG. 4B is a block diagram of an example semiconductor structure similar to the semiconductor structure of FIG. 4, for example, the example semiconductor structure including another example conductive structure.

Referring now to FIG. 4B, an example semiconductor structure similar to the semiconductor shown in FIG. 4 includes an example conductive structure 2260 similar to the conductive structure of the semiconductor structure shown in FIG. 3B and a conductive material 2470 similar to conductive material 1470, for example. The semiconductor structure includes cavities 1442, 1442', which may have a shape that is the same as or different from cavities 442, 442'

Figure 4C:
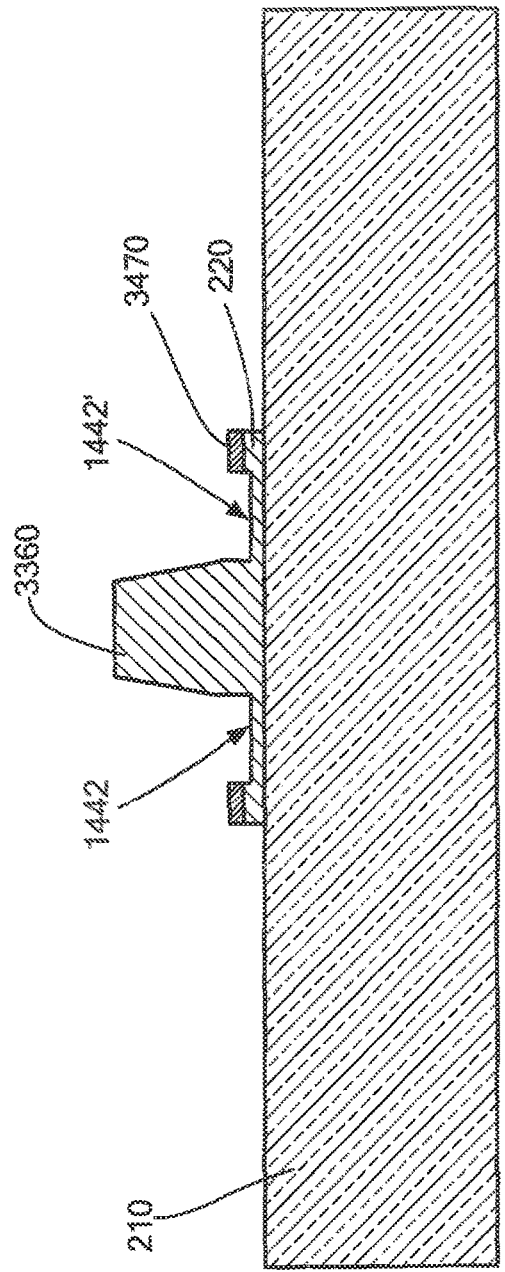
FIG. 4C is a block diagram of an example semiconductor structure similar to the semiconductor structure of FIG. 4, for example, the example semiconductor structure including another example conductive structure.

Referring now to FIG. 4C, an example semiconductor structure similar to the semiconductor shown in FIG. 4 includes an example conductive structure 3360 similar to the conductive structure of the semiconductor structure shown in FIG. 3B and a conductive material 3470 similar to conductive material 1470, for example.

Figure 5:
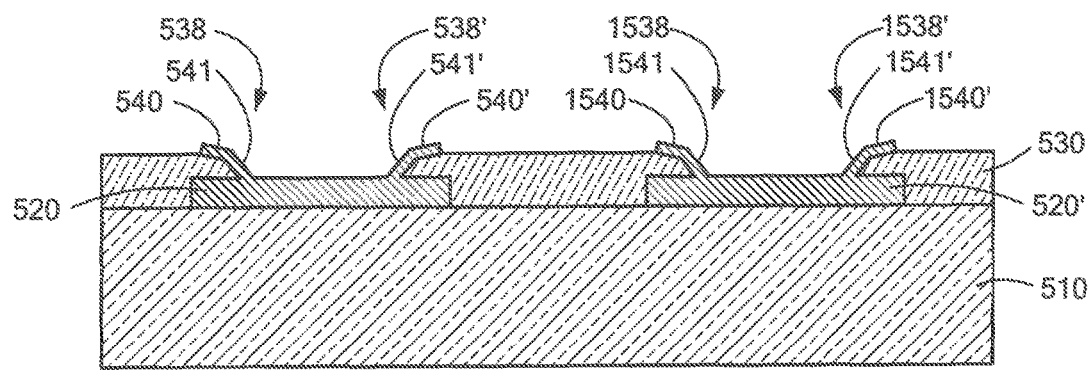
FIG. 5 is a block diagram of an example semiconductor structure.
Figure 5A:
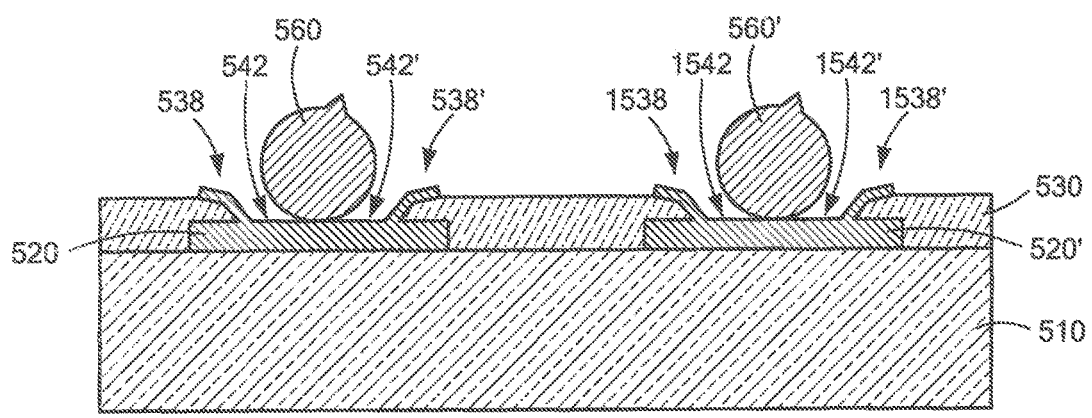
FIG. 5A is a block diagram of an example semiconductor structure including a plurality of conductive structures.
Figure 5B:
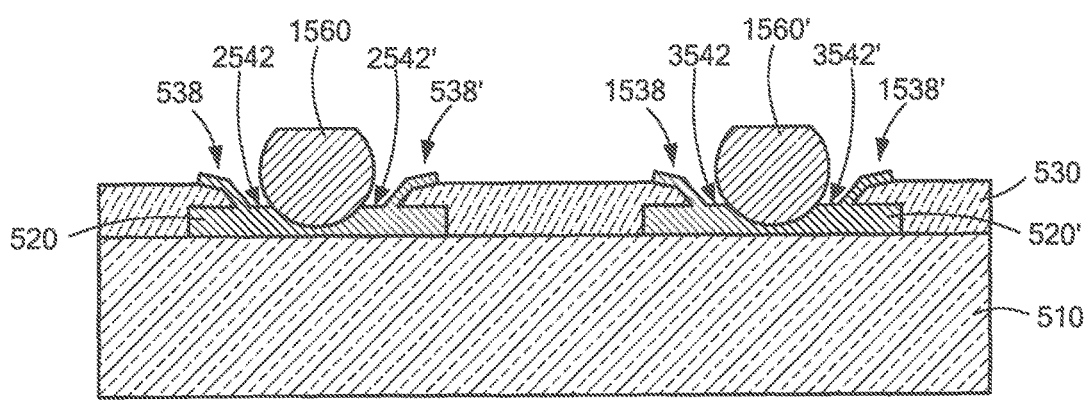
FIG. 5B is a block diagram of another example semiconductor structure including a plurality of conductive structures.

Referring now to FIGS. 5-5B, example semiconductor structures according to another embodiment are shown. Referring now to FIG. 5, a semiconductor structure includes a substrate 510, a plurality of interconnect pads (here, first and second interconnect pads 520, 520'), an isolating layer 530, and a plurality of pad interconnects (here, first, second, third and fourth pad interconnects 538, 538', 1538, 1538'). First and second interconnect pads 520, 520' are disposed over substrate 510. Additionally, isolating layer 530 is disposed over the substrate 510 and the first and second interconnect pads 520, 520'. The first and second interconnect pads 520, 520' are spaced apart from each other by a predetermined distance. The predetermined distance may, for example, be based upon spacing of interconnects in another semiconductor structure for which the semiconductor structure of FIG. 5 is to be coupled.

First and second pad interconnects 538, 538' have pad portions 540, 540' and interconnect portions 541, 541', respectively, which are similar first and second pad interconnects 238, 238' (FIG. 2). Similarly, third and fourth pad interconnects 1538, 1538' have pad portions 1540, 1540' and interconnect portions 1541, 1541'. In some embodiments, one or more portions of the pad interconnects 538, 538', 1538, 1538' are provided as part of the first and second interconnect pads 520, 520', respectively (e.g., to provide first and second interconnect pads with surfaces split between first and second surfaces of the isolating layer 530).

Referring now to FIG. 5A, in which like elements of FIG. 5 are provided having like reference designations, the semiconductor structure also includes a plurality of conductive structures (here, first and second conductive structures 560, 560') disposed over and electrically coupled to the first and second interconnect pads 520, 520', respectively. At least a portion of the first and second conductive structures 560, 560' extend a predetermined distance (e.g., between about eight μm and sixteen μm) above isolating layer 630. Additionally, the first and second conductive structures 560, 560' may have an associated diameter (e.g., a diameter having dimensions greater than or equal to about eighteen μm). Cavities 542, 542' exist between edges of interconnect portions 541, 541' of pad interconnect interconnects 538, 538' and edges of first conductive structure 560. Similarly, cavities 1542, 1542' exist between edges of interconnect portions 1541, 1541' of pad interconnect interconnects 1538, 1538' and edges of second conductive structure 560'.

In this example embodiment, the first and second conductive structures 560, 560', which may be the same as or similar to so-called "ball bumps," have a substantially spherical shape and a small length of conductive material (e.g., a wire) extending from at least a portion (e.g., a portion distal to the second surface of interconnect pads 520, 520') of the first and second conductive structures 560, 560'. This small length of conductive material or "tail" may, for example, exist as a result of the conductive material being pulled until the conductive material breaks at a point above a corresponding portion of the first and second conductive structures 560, 560'. In some embodiments the tail is undesirable (e.g., in certain flip chi assembly processes and applications), in which case surfaces of the first and second conductive structures 560, 560' containing the tail can be coined (or flattened) through a "coining" process to form conductive structures having a substantially flat, circular surface, as illustrated by conductive structures 1560, 1560' shown in the semiconductor structure of FIG. 5B, for example. The semiconductor structure of FIG. 5B includes cavities 1542, 1542', 2542, 2542' which may have shapes that are the same as or different from cavities 542, 542', 1542, 1542' shown in FIG. 5A.

In some embodiments, metal diffusion bonding exists between surfaces of the first and second conductive structures 560, 560' disposed over the first and second interconnect pads 520, 520', for example. Additionally, in some embodiments, portions of the first and second conductive structures 560, 560' disposed over the first and second interconnect pads 520, 520' have a contact area that is greater than that of opposing portions of the first and second conductive structures 560, 560'.

Figure 6A:
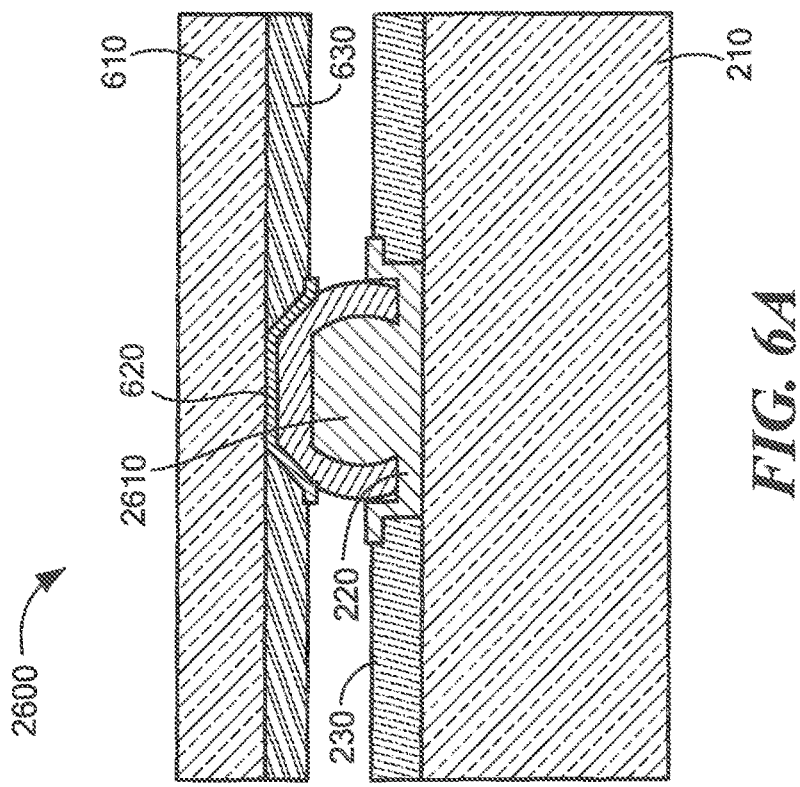
FIG. 6A is a block diagram of an example semiconductor device including the semiconductor structures of FIG. 6, for example.
Figure 6:
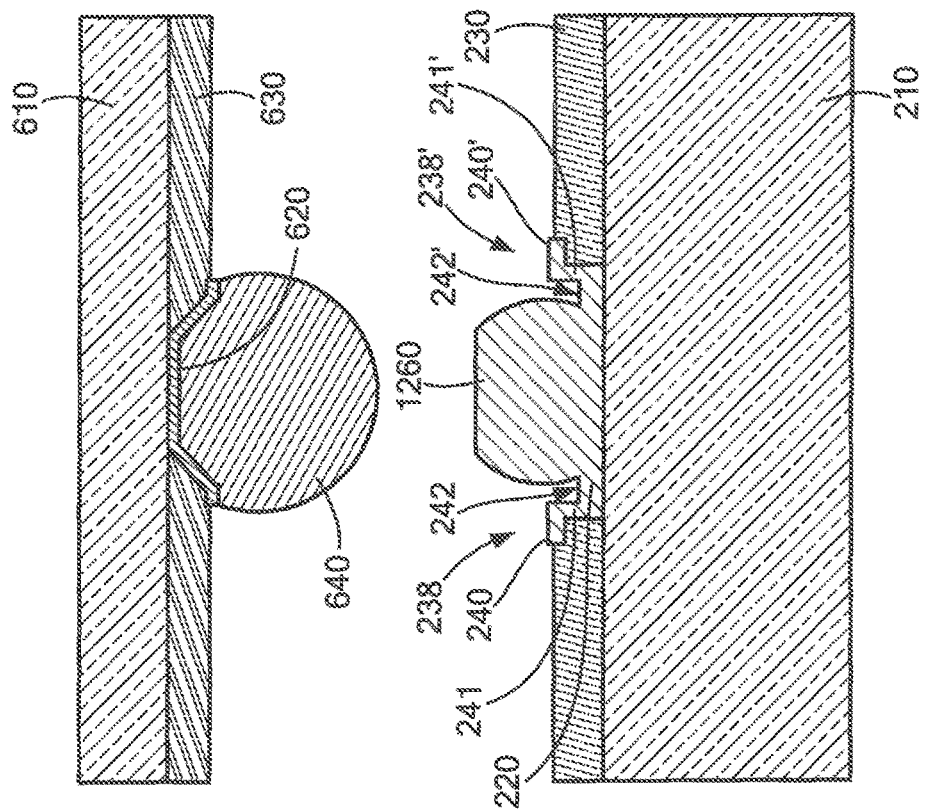
FIG. 6 is a block diagram of example semiconductor structures.

Referring now to FIG. 6, example semiconductor structures as may be provided as part of an example semiconductor device including at least two semiconductor structures (e.g., semiconductor device 2600, as will be discussed) are shown. In the example embodiment shown, a first one of the semiconductor structures (i.e., a first semiconductor structure), which is the same as the semiconductor structure shown in FIG. 2A, for example, includes at least a substrate 210, an interconnect pad 220, an isolating layer 230, a first and second pad interconnects 238, 238' and a conductive structure 1260. A first surface of substrate 210 corresponds to a first surface of the first semiconductor structure and a second opposing surface of substrate 210 corresponds to a second opposing surface of the first semiconductor structure. In some embodiments, fusible coupling structure 640 overcoats conductive structure 1260 (e.g., thereby minimizing interconnect width). The interconnect pad 220 and conductive structure 1260 may, for example, serve as an interposer for electrically and mechanically coupling the first semiconductor structure to another semiconductor structure (e.g., a second semiconductor structure, as will be discussed).

Additionally, a second one of the semiconductor structures (i.e., a second semiconductor structure) includes a substrate 610, an interconnect pad 620, an isolating later 630 and a fusible coupling structure 640 in the example embodiment shown. Substrate 610, similar to substrate 210, has first and second opposing surfaces and a plurality of electrical connections extending between the first and second surfaces. A first surface of substrate 610 corresponds to a first surface of the second semiconductor structure and a second surface of substrate 610 corresponds to a second opposing surface of the second semiconductor structure.

Interconnect pad 620 is disposed over select portions of the second surface of substrate 610 and isolating layer 630 is similarly disposed over the second surface of substrate 610 and a corresponding surface and one or more sides of interconnect pad 620. Fusible coupling structure 640, which may be provided as a solder ball or sphere, for example, is disposed over at least the second surface of substrate 610 and is electrically coupled to select ones of the plurality of electrical connections in substrate 610 (e.g., through interconnect pad 620). In some embodiments, the second semiconductor structure additionally includes an under-bump metallization (UBM) structure (not shown) for coupling fusible coupling structure 640 to interconnect pad 620. Interconnect pad 620 and fusible coupling structure 640 form an interconnect for coupling the second semiconductor structure to the first semiconductor structure. In some embodiments, the second semiconductor structure may additionally include one or more external interconnects, e.g., ball grid array (BGA), land grid array (LGA) or the like, on surfaces of the second semiconductor structure. Additionally, in some embodiments, one or more of the first semiconductor structure or the second semiconductor structure may include one or more dies. Further, in some embodiments, one or more of the first semiconductor structure or the second semiconductor structure may include semiconductor dies that may each provide an integrated circuit device or any other semiconductor circuits.

Fusible coupling structure 640 may include one or more of the following materials: tin-lead, bismuth-tin, bismuth-tin-iron, fin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. Such materials may melt during a bonding or a reflow process, for example.

Additionally, fusible coupling structure 640 may include a conductive paste, e.g., on a surface of the fusible coupling structure 640. The conductive paste may be a low viscosity conductive paste, an electrically conductive paste including at least one organic binder component and, in some embodiments, at least one metallic component. The at least one metallic component may include a plurality of "microparticles and or nanoparticles." In another embodiment, the conductive paste may include an organic binder, at least one metallic component and at least one solder component including a plurality of "microparticles and or nanoparticles." The conductive paste may be solid at a room temperature (e.g., between about twenty degrees Celsius (C) and about twenty-six degrees C.) but which has a viscosity that may drop significantly before curing at or above 60 C due to the organic binder. The organic binder can have a monomer and/or an oligomer and/or a polymer and/or a reducing agent. The conductive paste can be adapted for providing interconnections between fusible coupling structure 640 and conductive structure 1260.

In some embodiments, an organic flux material may be applied over one or more portions of fusible coupling structure 640 and/or conductive structure 1260 (e.g., prior to bonding). The organic flux material or coating can provide a temporary bond between fusible coupling structure 640 and conductive structure 1260 prior to bonding.

Further, in some embodiments, an epoxy material may be applied over one or more portions of conductive structure 1260 prior to coupling the first semiconductor structure and the second semiconductor structure together. The epoxy material may, for example, help with aligning fusible coupling structure 640 and conductive structure 1260 during coupling and provide for additional mechanical stability and reliability to a semiconductor structure (or device) resulting from coupling of the first semiconductor structure and the second semiconductor structure.

Referring now to FIG. 6A, an example semiconductor device 2600 as may be provided in an example method for fabricating a semiconductor device including at least two semiconductor structures (here, the first and second semiconductor structures of FIG. 6) in accordance with the concepts, systems, circuits and techniques sought to be protected herein is shown.

In the example method, the second surface of the second semiconductor structure is aligned with the second surface of the first semiconductor structure such that the second surfaces of the first and second semiconductor structures are substantially parallel to each other and spaced apart from each other by a predetermined separation distance.

Additionally, in the example method, the predetermined separation distance is decreased from a first distance to a second, lower distance such that the fusible coupling structure 640 of the second semiconductor structure and conductive structure 1260 of the first semiconductor structure are substantially in contact with each other. The second distance may be zero μm such that the fusible coupling structure 640 and conductive structure 1260 are physically in contact with each other prior to being coupled together.

Further, in the example method, the fusible coupling structure 640 and the conductive structure 1260 are exposed to an exposure energy (e.g., thermal energy from a heat-treatment or reflow process) having a predetermined intensity distribution for a predetermined time period to form an electrical connection 2610 between the first semiconductor structure and the second semiconductor structure. The electrical connection 2610 may, for example, be formed through a reflow process in which the fusible coupling structure 640 and the conductive structure 1260 are subjected to controlled thermal energy, which melts one or more portions of fusible coupling structure 840 and conductive structure 1260 together. The opening in the isolating layer 210 may store excess solder from interconnect 2610 (e.g., to prevent electrical shorts between the first and second semiconductor structures). In some embodiments, fusible coupling structure 640 overcoats conductive structure 1260 (e.g., thereby minimizing interconnect width).

In embodiments where fusible coupling structure 640 is provided from a Eutectic Tin-lead solder material and conductive structure 1260 is provided from a gold material, for example, the fusible coupling structure 640 may be subject to a controlled thermal energy having a temperature between about 187 degrees Celsius (C) and about 220 C and overcoat one or more portions of conductive structure 1260. Additionally, in embodiments where fusible coupling structure 640 is provided from a tin, silver, or copper material or a combination of materials thereof (e.g., SAC305), the fusible coupling structure 640 may be subject to a controlled thermal energy having a temperature between about 217 C and about 240 C and overcoat one or more portions of conductive structure 1260. Further, in embodiments where fusible coupling structure 640 is provided from a Eutectic Tin-lead solder material and conductive structure 1260 is provide from a tin, silver, or toper material or a combination of materials thereof, the fusible coupling structure 640 may be subject to a controlled thermal energy having a temperature between about 187 C and about 197 C and overcoat one or more portions of conductive structure 1260.

In alternative embodiments, the fusible coupling structure 640 and the conductive structure 1260 may be electrically coupled through thermosonic or thermocompression bonding methods or techniques, for example.

Additionally, in some embodiments, in conjunction with operation of a handler, gravity and friction between the conductive structure 1260 and fusible coupling structure 640 keeps the first and second semiconductor structures in place until they are electrically coupled together. Further, a solder paste (e.g., consisting of glue, flux, and solder) may, for example, be applied at a point of contact of the conductive structure 1260 and fusible coupling structure 640 to hold the first and second semiconductor structures in place until one or more of the conductive structure 1260 and the fusible coupling structure 640 are melted, or "reflowed," in an oven to make the electrical connect on 2610.

Further, in some embodiments, it is also possible that fusible coupling structure 640 and conductive structure 1260 are misaligned (or misregistered) with respect to each other, as will be further discussed in conjunction with FIGS. 10-12B, for example, in such embodiments, an electrical connection (e.g., electrical connection 2610) may still be formed between one or more portions of fusible coupling structure 640 and one or more portions of conductive structure 1260 during a melting or reflow process.

In accordance with one aspect of the concepts, systems, circuits and techniques described herein, the approaches described above are capable of reducing pitch between the first and second semiconductor structures (and, thus, producing a semiconductor device 2600 with reduced pitch). Semiconductor device 2600 may, for example, be formed in a single semiconductor package or in a package-on-package (POP) structure.

Referring now to FIG. 7, in which like elements of FIG. 6 are provided having like reference designations, example first and second semiconductor structures as may be provided as part of another example semiconductor device including at least two semiconductor structures (e.g., semiconductor device 2700, as will be discussed) are shown. A first one of the semiconductor structures (i.e., a first semiconductor structure) includes at least a substrate 210, an interconnect pad 220, an isolating layer 230, first and second pad interconnects 238, 238' and a conductive structure 1260. A second one of the semiconductor structures (i.e., a second semiconductor structure) of FIG. 7 is similar to the second semiconductor structure of FIG. 6 except that the fusible coupling structure (here, fusible coupling structure 740) is provided as a self-aligned contact (SAC) pad in the example embodiment shown.

Referring now to FIG. 7A, in which like elements of FIG. 6A are provided having like reference designations, an example semiconductor device 2700 as may be provided in an example method for fabricating a semiconductor device including at least two semiconductor structures (here, the first and second semiconductor structures of FIG. 7) is shown.

Similar to method described above in conjunction with FIG. 6A, the fusible coupling structure 740 of the second semiconductor structure and the conductive structure 1260 of the first semiconductor structure are aligned, spaced apart by a predetermined separation distance and exposed to en exposure energy (e.g., thermal energy) having a predetermined intensity distribution for a predetermined time period to form an electrical connection 2710 between the first semiconductor structure and the second semiconductor structure. In some embodiments, the fusible coupling structure 740 overcoats a substantial portion (e.g., at least half of a surface) of the conductive structure 1260 in forming electrical connection 2710 (e.g., to prevent X-Y spreading or deformation of conductive structure 1260 and minimize joint resistance of electrical connection 2710).

It should, of course, be appreciated that although examples of fusible coupling structures 640 and 740 of FIGS. 6-7A are described as a solder ball and a self-aligned contact (SAC) pad, respectively, other suitable interconnect structures and techniques may be used alone or in combination for fusible coupling structures, including, e.g., solder bumps, solder coated bumps, solder coated micro pillars and associated bonding techniques.

Figure 8:
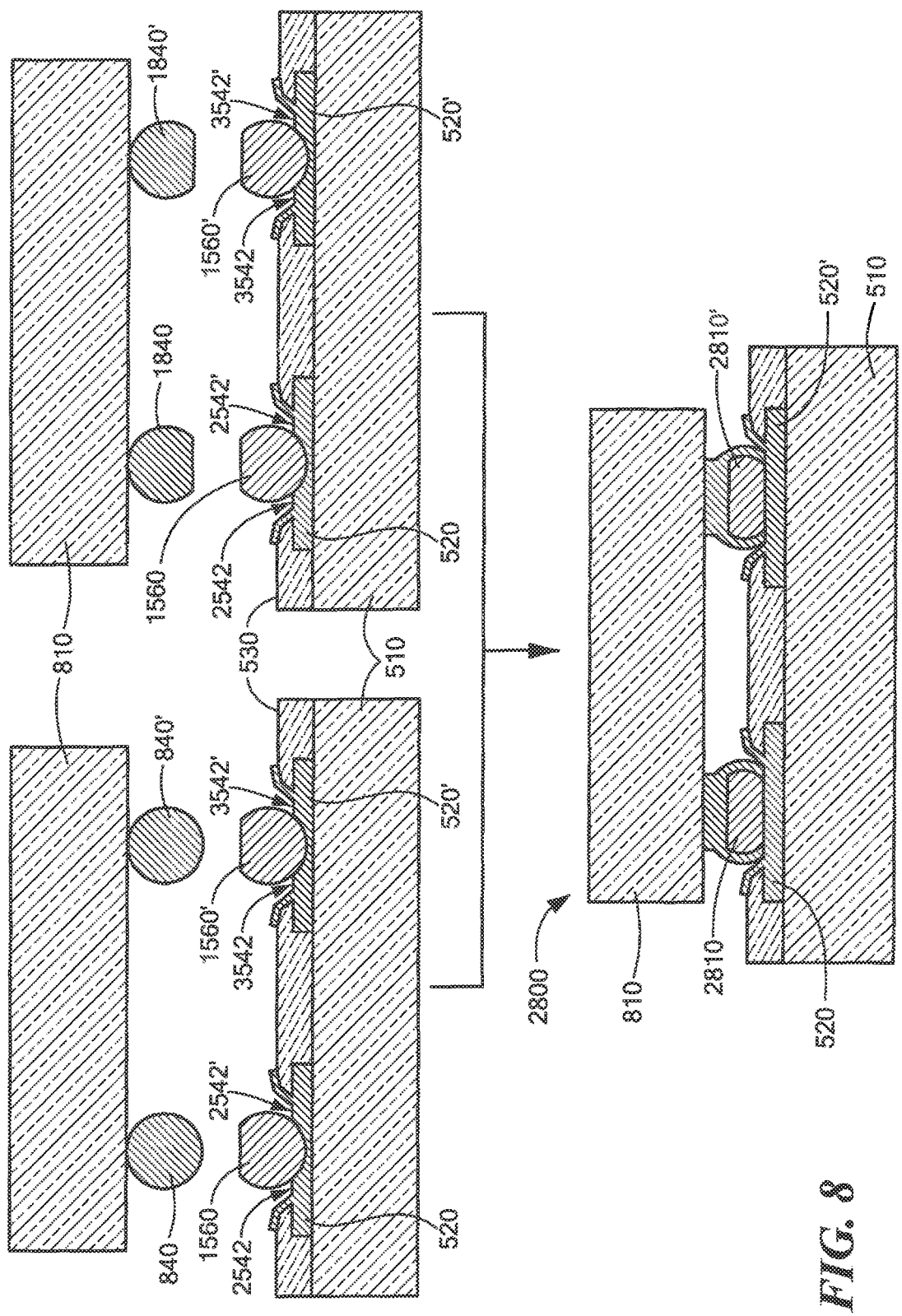
FIG. 8 is a block diagram of example semiconductor structures and an example semiconductor device including the example semiconductor structures.

Referring now to FIG. 8, example sets of semiconductor structures as may be provided as part of an example semiconductor device including at least two semiconductor structures (e.g., semiconductor device 2800, as will be discussed) are shown. In the example embodiment shown, first ones of the semiconductor structures (i.e., first semiconductor structures) of each set are the same as the semiconductor structure shown in FIG. 5B, for example, including at least a substrate 510, first and second interconnect pads 520, 520', an isolating layer 530, first and second conductive structures 1560, 1560' and first and second pad interconnects 568, 568'. A second one of the semiconductor structures (i.e., a second semiconductor structure) of a first one of the sets includes a substrate 810 and first and second fusible coupling structures 840, 840', each of which may be the same as or similar to fusible coupling structure 640 of FIG. 6, for example. Additionally, a second one of the semiconductor structures (i.e., a second semiconductor structure) of a second one of the sets is similar to the second semiconductor structure of the first one of the sets except that the fusible coupling structures (here, fusible coupling structures 1840, 1840') are provided having a substantially flat (or coined) portion.

The first and second semiconductor structures of each set may, for example, be aligned, spaced apart, and electrically coupled (i.e., bonded) together in a same or similar way as that which is shown in FIGS. 6A and 7A to form electrical connections 2810, 2810' and provide a semiconductor device 2800 including at least the first and second semiconductor structures.

In some embodiments, first and second conductive structures 1560, 1560' may compensate for height or diameter variations of first and second fusible coupling structures 840, 840' and first and second fusible coupling structures 1840, 1840'. Additionally, in some embodiments, first and second conductive structures 1560, 1560' may provide for improved bonding and interconnect conductivity between the first and semiconductor structures due to a greater amount a conductive materials existing in spaces between edges of the openings formed in the isolating layer 530 and the first and second conductive structures 1560, 1560' disposed in the openings of the first semiconductor structure. Further, in some embodiments, first and second fusible coupling structures 840, 840' of the first set and first and second fusible coupling structures 1840, 1840' of the second set may overcoat the first and second conductive structures 1560, 1560' in forming electrical connections 2810, 2810' to substantially reduce or eliminate potential interconnect deformation (e.g., solder bridging or deformation) between the first and second semiconductor structures.

Figure 9A:
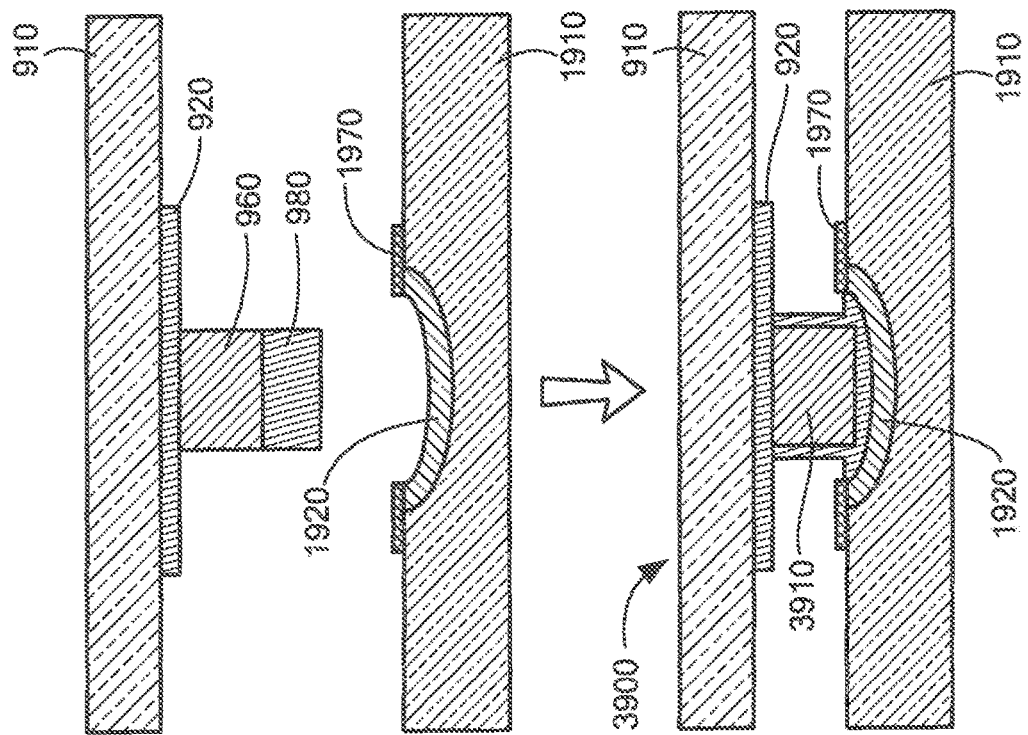
FIG. 9A is a block diagram of example semiconductor structures and another example semiconductor device including the example semiconductor structures.
Figure 9:
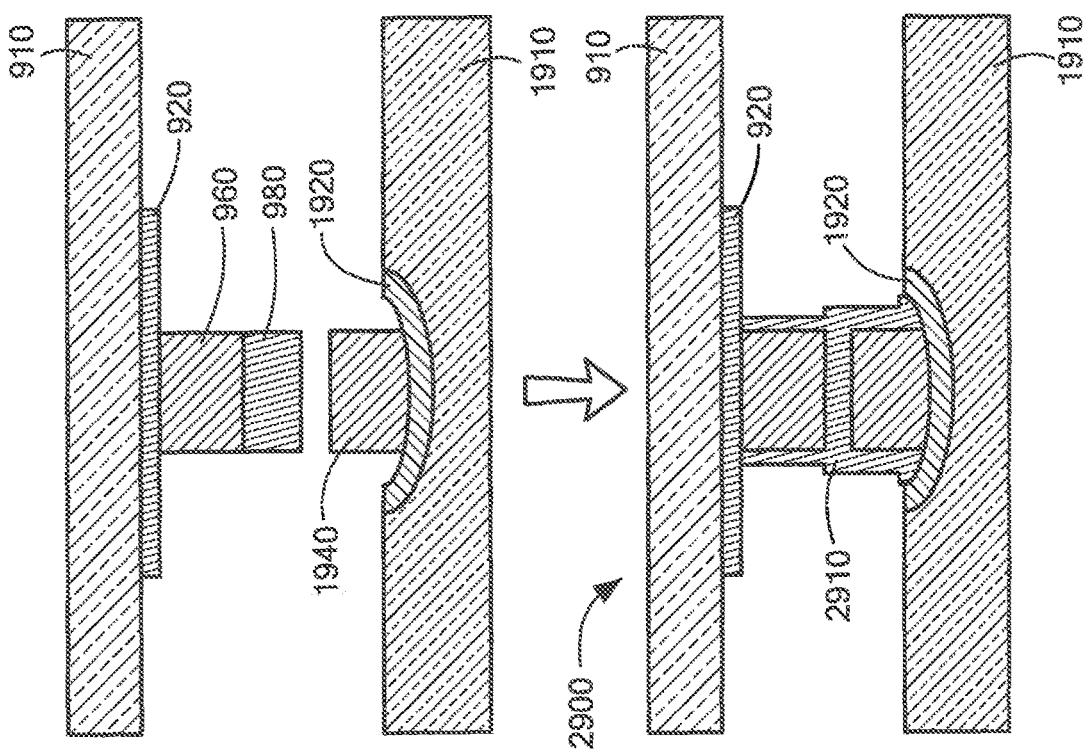
FIG. 9 is a block diagram of example semiconductor structures and another example semiconductor device including the example semiconductor structures.

Referring now to FIG. 9, example semiconductor structures as may be provided as part of an example semiconductor device including at least two semiconductor structures (e.g., semiconductor device 2900, as will be discussed) are shown.

A first one of the semiconductor structures (i.e., a first semiconductor structure) includes a substrate 910, an interconnect pad 920, a conductive structure 960 (e.g., having a shape that is the some as or similar to a micro pillar, stud or ball) and a solder tip 980. The solder tip 960 is disposed over one or more surfaces of conductive structure 960 and, in some embodiments, is provided as part of the conductive structure 960. A first surface of substrate 910 corresponds to a first surface of the first semiconductor structure and a second opposing surface of substrate 910 corresponds to a second opposing surface of the first semiconductor structure.

A second one of the semiconductor structures (i.e., a second semiconductor structure) includes a substrate 1910, an interconnect pad 1920, a fusible coupling structure 1940. The interconnect pad 1920 may, for example, be provided having a curved shape as shown in FIG. 9. Additionally, the fusible coupling structure 1940 may, for example, be the same as or similar to the conductive structure 960 in the example embodiment shown. A first surface of substrate 1910 corresponds to a first surface of the first semiconductor structure and a second opposing surface of substrate 1910 corresponds to a second opposing surface of the first semiconductor structure.

In some embodiments, the first and second semiconductor structures may be aligned, spaced apart, and electrically coupled together in a same or similar way as that which is shown in FIGS. 6A and 7A (e.g., using assembly reflow), for example, to form an electrical connection 2910 and provide a semiconductor device 2900 including at least the first and second semiconductor structures. Additionally, the solder tip 980 may melt and electrically couple conductive structure 960 and fusible coupling structure 1940 together. Excess solder, which may be provided from at least one of the solder tip 980, conductive structure 960 and fusible coupling structure 1940 (e.g., in embodiments where conductive structure 960 and/or fusible coupling structure 1940 include solder), may be stored in portions (e.g., curved portions) of interconnect pad 1920 extending from edges of fusible coupling structure 1940 to substrate 1910. Solder may also flow over surfaces of conductive structure 960 and fusible coupling structure 1940 using capillary action, for example. At least part of interconnect pads 920 and 1920 may also be "wetted" with solder during a bonding/reflow process through capillary action.

Referring now to FIG. 9A, in which like elements of FIG. 9 are provided having like reference designations, example semiconductor structures as may be provided as part of an example semiconductor device (e.g., semiconductor device 3900, as will be discussed) are shown.

A first one of the semiconductor structures (i.e., a first semiconductor structure) includes a substrate 910, an interconnect pad 920, a conductive structure 960 and a solder tip 980. A second one of the semiconductor structures (i.e., a second semiconductor structure) is similar to the second semiconductor structure of FIG. 9 except that the second semiconductor structure of FIG. 9A includes one or more solder dams (e.g., solder dam 1970) and does not include a fusible conductive structure fusible conductive structure 1940). The solder dams may, for example, be disposed over select surfaces of interconnect pad 1920 and substrate 1910 and be used to prevent excess solder from flowing onto surfaces of the substrate 1910. Edges of the interconnect pad 1920 have a low surface energy metal (e.g., as may be provided as part of solder dam 1970) which helps to prevent solder flow beyond the interconnect pad 1920 to substantially reduce or eliminate electrical shorts.

The first and second semiconductor structures may be aligned, spaced apart, and electrically coupled together in a same or similar way as that which is shown in FIG. 9 to form an electrical connection 3910 and provide a semiconductor device 3900 including at least the first and second semiconductor structures.

Figure 10:
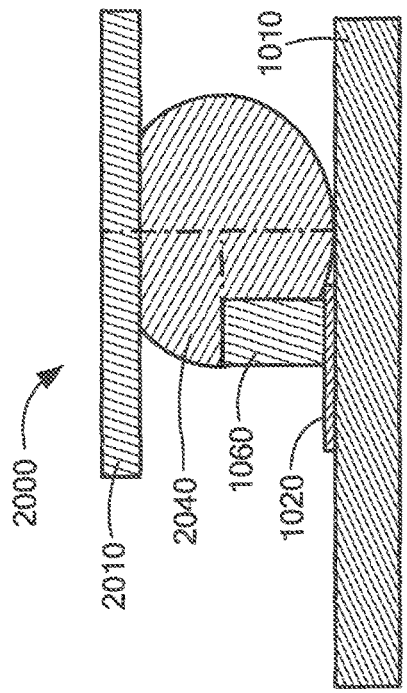
FIG. 10 is a block diagram of example semiconductor structures.

Referring now to FIG. 10, example first and second semiconductor structures as may be provided as part of an example semiconductor device including at least two semiconductor structures (e.g., semiconductor device 2000, as will be discussed) are shown. A first one of the semiconductor structures (i.e., a first semiconductor structure) includes a substrate 1010, an interconnect pad 1020, and a conductive structure 1260. A first surface of substrate 1010 corresponds to a first surface of the first semiconductor structure and a second opposing surface of substrate 1010 corresponds to a second opposing surface of the first semiconductor structure.

Additionally, a second one of the semiconductor structures (i.e., a second semiconductor structure) includes a substrate 2010 and a fusible coupling structure 2040. A first surface of substrate 2010 corresponds to a first surface of the second semiconductor structure and a second opposing surface of substrate 2010 corresponds to a second opposing surface of the second semiconductor structure.

Figure 10A:
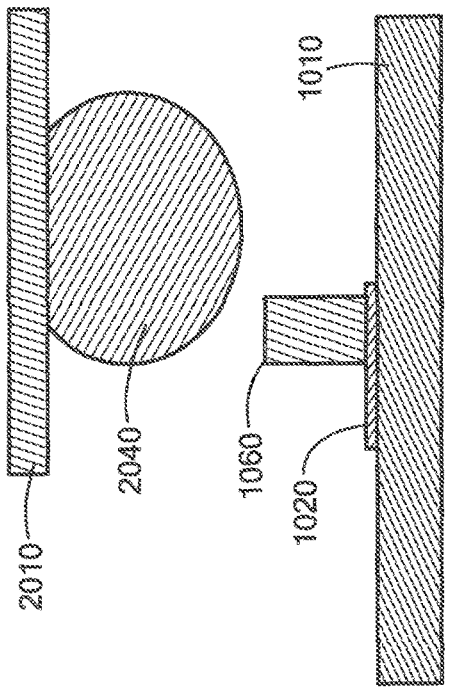
FIG. 10A is a block diagram of an example semiconductor device including the semiconductor structures of FIG. 10, for example.

As illustrated, the first and second semiconductor structures (and, thus, conductive structure 1260 and fusible coupling structure 2040) are misaligned (or misregistered) with respect to each other. Misalignment may, for example, occur due to design or fabrication errors with the semiconductor structures, or imprecisions in methods and/or apparatuses used to align the semiconductor structures. In accordance with the concepts, systems, circuits and techniques disclosed herein, even though the first and second semiconductor structures are misaligned, semiconductor device 2000 is "electrically good" as long as conductive structure 1260 is electrically coupled to at least a portion of fusible coupling structure 2040 (e.g., aligned and contact within a radius and or deformed radius of fusible coupling structure 2040 during bonding), to produce a structure as illustrated in FIG. 10A after a melting or reflow process. The foregoing may, for example, substantially reduce or eliminate electrical opens in semiconductor devices including at least two semiconductor structures where at least one of the semiconductor structures is misaligned even with fusible coupling structure having a deformed radius.

Figure 11:
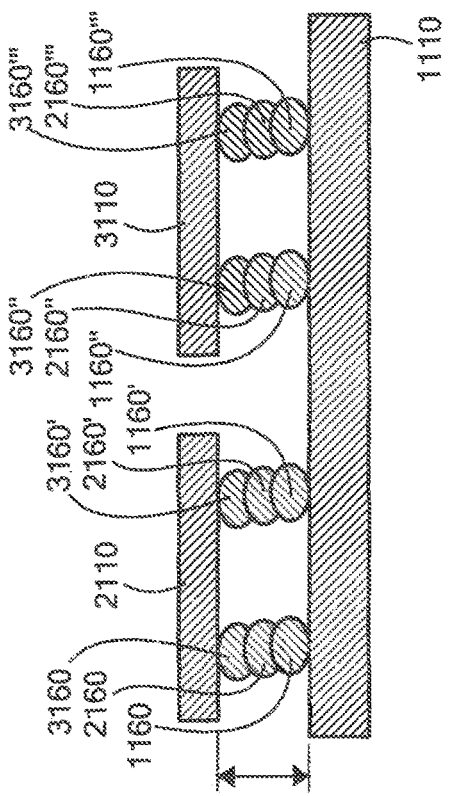
FIG. 11 is a block diagram of an example semiconductor device including a plurality of semiconductor structures.
Figure 11A:
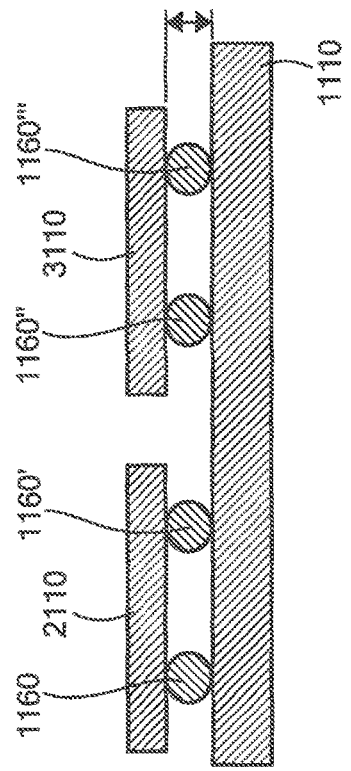
FIG. 11A is a block diagram of an example semiconductor device similar to the semiconductor device of FIG. 11, for example, the example semiconductor device including a plurality of semiconductor structures and a plurality of stacked conductive structures.

Referring now to FIG. 11, another example semiconductor device includes a first semiconductor structure 1110, a second semiconductor structure 2110 and a third semiconductor structure 3110. First semiconductor structure 1110 is electrically coupled to second semiconductor structure 2110 through first and second conductive structures 1160, 1160'. Additionally, first semiconductor structure 1110 is electrically coupled to third semiconductor structure 3110 through third and fourth conductive structures 1160", 1160'". The first semiconductor structure 1110 is spaced apart from the second and third semiconductor structures 2110, 3110 by a first predetermined distance (e.g., between about 75 μm and about 250 μm or more). Additionally, the first conductive structure 1160 is spaced apart from the second conductive structure 1160' by a second predetermined distance (e.g., between about 10 μm and about 250 μm or more). The first predetermined distance and/or the second predetermined distance may be determined at least in part by size and shape of conductive structures 1160, 1160', 1160" and 1160'".

Referring now to FIG. 11A, in which like elements of FIG. 11 are provided having like reference designations, the first semiconductor structure 1110 is spaced apart from the second and third semiconductor structures 2110, 3110 by a second, greater predetermined distance (e.g., between about 100 μm and about 500 μm or more). The predetermined distance between first semiconductor structure 1110 and the second and third semiconductor structures 2110, 3110 may, for example, be increased by stacking conductive structures (e.g., conductive structures 3160 and 2160 onto conductive structure 1160, conductive structures 3160' and 2160' onto conductive structure 1160', conductive structures 3160" and 2160" onto conductive structure 1160", and conductive structures 3160'" and 2160'" onto conductive structure 1160'"). The shape and size of the conductive structures can also be adjusted to achieve a desired distance between first semiconductor structure 1110 and the second and third semiconductor structures 2110, 3110 (and, thus a desired height and pitch for the semiconductor device) Conductive structures 1160, 2160, 3160 may have diffusion and or van der walls bonding at the interface. Additionally, in some embodiments, conductive structures 3160, 3160', 3160" are implemented as fusible structure like 2040 in FIG. 10. In such embodiments, conductive structures 3160, 3160', 3160" may melt during reflow to create a reliable interface between conductive structures 1160, 2160, 3160 and also provide a specific gap between first semiconductor structure 1110 and second and third semiconductor structures 2110, 3110. This structure may provide for device isolation from a "lossy" substrate.

Figure 12:
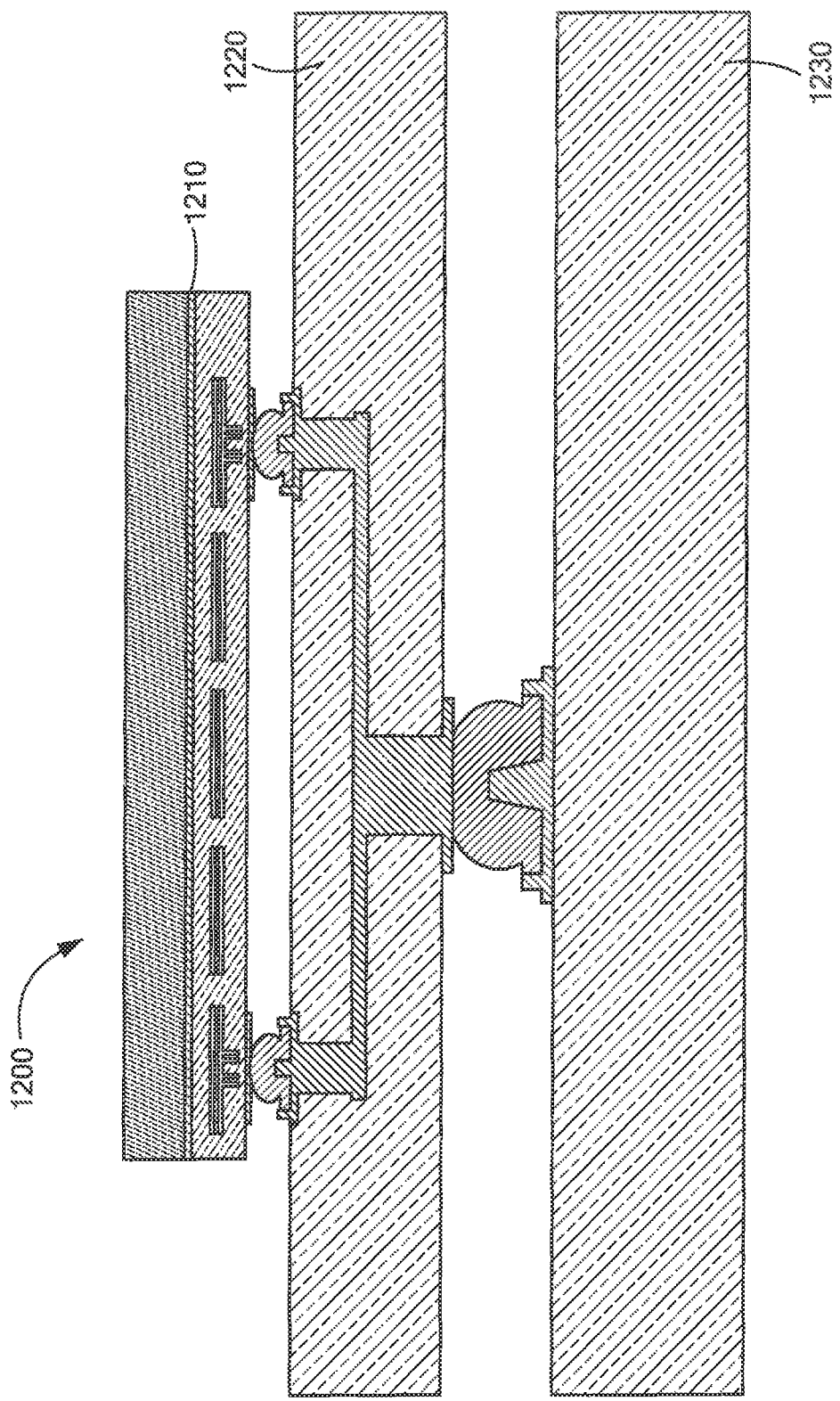
FIG. 12 is a block diagram of another example semiconductor device including a plurality of semiconductor structures.

Referring now to FIG. 12, an example semiconductor device 1200 using conductive structures (and, in some embodiments, modified interconnect pads) for finer pitch interconnects, as discussed in the examples above, includes a first semiconductor structure 1210, a second semiconductor structure 1220 and a third semiconductor structure 1230. In the example embodiment shown, first semiconductor structure 1210 is provided as an integrated circuit (IC) (e.g., a processor, memory or logic device), second semiconductor structure 1220 is provided as a single or multi-layer multi-chip module (MCM) or substrate and third semiconductor structure 1230 is provided as a single or multi-layer printed circuit board (PCB). The first, second and third semiconductor structures 1210, 1220, 1230 are electrically coupled to each other through interconnects including conductive structures, as shown between each of the first, second, and third semiconductor structures 1210, 1220, 1230.

Figure 12A:
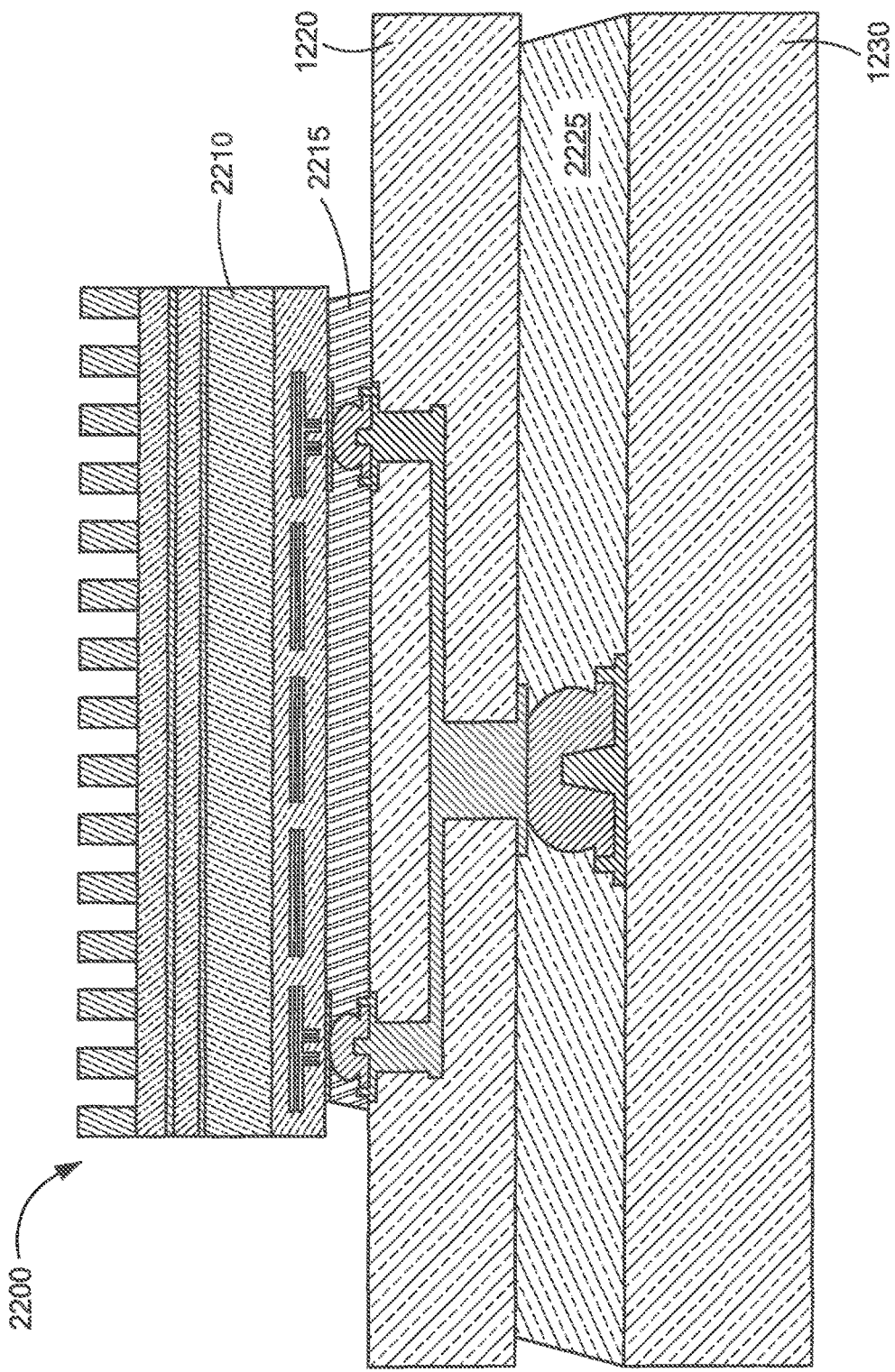
FIG. 12A is a block diagram of another example semiconductor device including a plurality of semiconductor structures.

Referring now to FIG. 12A, in which like elements of FIG. 12 are provided having like reference designations, another example semiconductor device 2200 using conductive structures (and, in some embodiments, modified interconnect pads) for finer pitch interconnects includes a first semiconductor structure 2210, a second semiconductor structure 1220 and a third semiconductor structure 1230. The first semiconductor structure 2210 is similar to first semiconductor structure 1210 of FIG. 11 except that first semiconductor structure 2210 also includes a heat sink device coupled to surfaces of the IC. Additionally, spaces existing between first and second semiconductor structures 2210, 1220 and second and third semiconductor structures 1220, 1230 are "underfilled" with electrically-insulating materials 2215, 2225, for example (e.g., to provide a stronger mechanical connection and a heat bridge between the semiconductor structures).

Figure 12B:
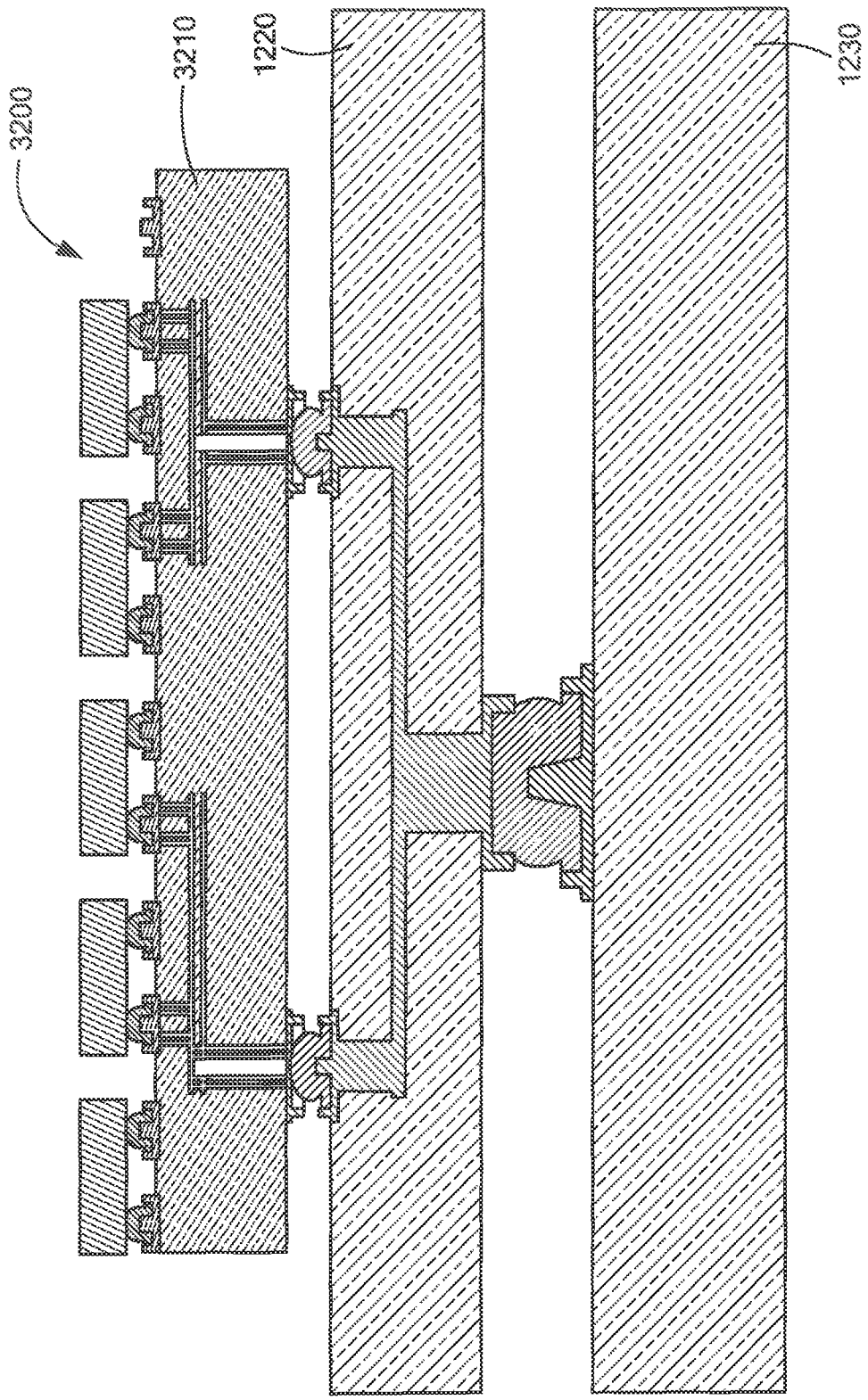
FIG. 12B is a block diagram of another example semiconductor device including a plurality of semiconductor structures.

Referring now to FIG. 12B, in which like elements of FIG. 12 are provided having like reference designations, another example semiconductor device 3200 using conductive structures (and, in some embodiments, modified interconnect pads) for finer pitch interconnects includes a first semiconductor structure 3210, a second semiconductor structure 1220 and a third semiconductor structure 1230. First semiconductor structure 3210 includes an interposer and a plurality of semiconductor structures (e.g., processors) coupled to select surfaces of the interposer. An encapsulant or molding compound (not shown) such as epoxy resin may be used to encapsulate the semiconductor device 3200 (and select ones of the semiconductor devices discussed in the examples above) to form a semiconductor package.

While the above figures illustrate various semiconductor structures and devices including a certain number of dies, interconnects, substrates, IC devices, components and the like, the concepts, systems, circuits and techniques disclosed herein may be applied to semiconductor structures and devices including any number of dies, interconnects, substrates, IC devices, components and the like.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate semiconductor structures and devices having reduced pitch in comparison to conventional semiconductor structures and devices.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. Accordingly, it is submitted that the scope of the patent should not be limited to the described embodiments but rather should be limited only by the spirit and scope of the following claims.

Accordingly, it is submitted that that scope of the patent should not be limited to the described embodiments but rather should be limited only by the spirit and scope of the following claims.

What is claimed is:

1. A semiconductor structure, comprising:
   a substrate having first and second opposing surfaces;
   one or more interconnect pads having first and second opposing surfaces, wherein the first surface of each one of the interconnect pads is disposed over or beneath select portions of at least the second surface of the substrate;
   an isolating layer having first and second opposing surfaces and openings formed in select portions of the isolating layer extending between the second surface of the isolating layer and the second surfaces of the interconnect pads, wherein the first surface of the isolating layer is disposed over the second surface of the substrate and the second surfaces of the interconnect pads;

one or more pad interconnects having a pad portion and an interconnect portion, wherein the pad portion of each one of the pad interconnects has a surface disposed over select portions of the second surface of the isolating layer, and the interconnect portion of each one of the pad interconnects extends from the pad portion to the second surfaces of the interconnect pads and has a surface disposed over select edges of the isolating layer openings; and one or more conductive structures disposed in respective ones of the isolating layer openings, wherein the conductive structures each project from the second surface of a respective one of the interconnect pads to form an interconnect for electrically and mechanically coupling the semiconductor structure to other semiconductor structures and devices, and the conductive structures each have first and second opposing portions, wherein the second portion of the conductive structures has a substantially flat surface extending a predetermined distance above the second surface of the isolating layer, and one or more cavities exist between edges of the conductive structures and edges of the interconnect portions of the pad interconnects in the isolating layer openings.

2. The semiconductor structure of claim 1 wherein the conductive structures are provided from one or more fusible conductive materials.

3. The semiconductor structure of claim 1 wherein each of the conductive structures has a substantially spherical shape.

4. The semiconductor structure of claim 3 wherein the conductive structures have a diameter of at least about eighteen micrometers (μm).

5. The semiconductor structure of claim 1 wherein the predetermined distance is between about sixteen μm and about eighteen μm.

6. The semiconductor structure of claim 1 wherein the first portion of the conductive structures corresponds to a first surface of the conductive structures, and the second portion of the conductive structures corresponds to a second surface of the conductive structures, and the first surface of the conductive structures has a surface area that is larger than a surface area of the second surface of the conductive structures.

7. The semiconductor structure of claim 1 wherein the isolating layer is provided from a polymer material.

8. The semiconductor structure of claim 1 wherein the isolating layer is provided as at least one of a passivation layer and a solder mask.

9. The semiconductor structure of claim 1 further comprising:
a conductive layer disposed over at least select portions of the second surface of the isolating layer and surfaces of the openings in the isolating layer extending from the second surface of the isolating layer to first surfaces of the interconnect pads over which the first surface of the isolating later is disposed, wherein the conductive layer is electrically coupled to the second surfaces of the interconnect pads.

10. The semiconductor structure of claim 1 wherein the cavities comprise a space of between about one micrometer (μm) and about one-hundred μm between the edges of the interconnect portions and the edges of the conductive structures.

11. The semiconductor structure of claim 1 wherein each of the interconnect pads has a separate corresponding opening in the isolating layer.

12. The semiconductor structure of claim 1 wherein the semiconductor structure is provided as part of a tunable filter and said substrate includes at least three layers, wherein a first one of the layers includes a first resonator circuit, a second one of the layers includes a second resonator circuit, and a third one of the layers includes a third resonator circuit, wherein the first, second and third resonator circuits are combinable to provide a tunable filter circuit having a multi-octave response characteristic.

13. A method for fabricating a semiconductor device, comprising:
providing a first semiconductor structure including:
a first substrate having first and second opposing surfaces;
one or more first interconnect pads having first and second opposing surfaces, wherein the first surface of each one of the first interconnect pads is disposed over selected portions of at least the second surface of the first substrate;
a first isolating layer having first and second opposing surfaces and openings formed in select portions of the first isolating layer, wherein the first surface of the first isolating layer is disposed over the second surface of the first substrate and the second surfaces of the first interconnect pads, and the first isolating layer openings extend between the second surface of the first isolating layer and the first surface of the first isolating layer;
one or more pad interconnects having a pad portion and an interconnect portion, wherein the pad portion of each one of the pad interconnects has a surface disposed over select portions of the second surface of the first isolating layer, and the interconnect portion of each one of the pad interconnects extends from the pad portion to the second surfaces of the first interconnect pads and has a surface disposed over selected edges of the first isolating layer openings; and
one or more conductive structures disposed in respective ones of the first isolating layer openings, wherein the conductive structures each have a first portion coupled to the second surface of a respective one of the first interconnect pads, and a second opposing portion that extends a predetermined distance above the second surface of the first isolating layer, wherein the second portion of the conductive structures has a substantially coined or flat surface, and one or more cavities exist between edges of the conductive structures and edges of the interconnect portions of the pad interconnects in the first isolating layer openings,
providing a second semiconductor structure including:
a second substrate having first and second opposing surfaces;
a second isolating layer having first and second opposing surfaces and one or more openings formed in select portions of the second isolating layer, wherein the first surface of the second isolating layer is disposed over the second surface of the second substrate, and the second isolating layer openings extend between the second surface of the second isolating layer and the first surface of the second isolating layer;

one or more second interconnect pads having first and second opposing surfaces, wherein the second interconnect pads are disposed in respective ones of the second isolating layer openings and the first surface of each one of the second interconnect pads is disposed over and coupled to at least the second surface of the second substrate; and one or more fusible coupling structures disposed over and coupled to second surfaces of respective ones of the second interconnect pads;

aligning the second semiconductor structure with the first semiconductor structure such that the second surface of the second substrate of the second semiconductor structure and the second surface of the first substrate of the first semiconductor structure are substantially parallel to each other and spaced apart from each other by a predetermined separation distance;

decreasing the predetermined separation distance from a first distance to a second, lower distance such that the fusible coupling structures of the second semiconductor structure and the conductive structures of the first semiconductor structure are substantially in contact with each other; and exposing at least one of the fusible coupling structures of the second semiconductor structure and the conductive structures of the first semiconductor structure to an exposure energy having a predetermined intensity distribution for a predetermined time period to form an electrical connection between the first semiconductor structure and the second semiconductor structure, wherein the fusible coupling structures melt and substantially overcoat the conductive structures, and at least a portion of the fusible coupling structures is received in the cavities in the first semiconductor structure.

14. The semiconductor structure of claim 1 wherein the cavities have a predetermined shape and the predetermined shape of the cavities is selected based on a desired space for storing the solder in the cavities.

15. The semiconductor structure of claim 1 wherein the pad portions of the pad interconnects and the interconnect portions of the pad interconnects each have dimensions selected based on a desired spread of the solder within the cavities.

16. The semiconductor structure of claim 1 wherein the isolating layer openings have dimensions which are less than like dimensions of the second surface of the interconnect pad on which the isolating layer is disposed.

17. The semiconductor structure of claim 1 wherein the predetermined distance that the second portion of the conductive structures extends above the second surface of the first isolating layer is selected such that the conductive structures are capable of compensating for structural misalignment between the first semiconductor structure and the other semiconductor structures.

18. The semiconductor structure of claim 1 wherein the first semiconductor structure further comprises a solder tip disposed over the second portion of the conductive structures.

19. A semiconductor device, comprising;
(a) a first semiconductor structure, including:
(a1) a first substrate having first and second opposing surfaces;
(a2) a first isolating layer disposed over the second surface of said first substrate, said first isolating layer having an exposed top surface and one or more openings provided in select portions thereof through which the second surface of said substrate is exposed and wherein a wall portion of each isolating layer which defines an opening is provided having a recess region;
(a3) a substrate interconnect structure disposed in each of the openings provided in said first isolating layer, each of said substrate interconnect structures comprising:
(a31) an interconnect pad disposed over the exposed second surface of said first substrate in the opening of the first isolating layer;
(a32) an isolating layer interconnect pad disposed on the recess region of said isolating layer, said isolating layer interconnect pad having a thickness such that an exposed surface of said isolating layer interconnect pad is above the exposed top surface of said isolating layer; and
(a33) an interconnect portion having a first end coupled to a portion of said isolating layer interconnect pad and a second end coupled to a portion of said interconnect pad; and
(a4) one or more conductive structures, each of the one or more conductive structures disposed in a respective one of the one or more openings in said first isolating layer and projecting from a surface of the interconnect pad, wherein the conductive structures each have a first portion coupled to the interconnect pad of said substrate interconnect structure and a second opposing portion that extends a predetermined distance above the exposed surface of the first isolating layer, wherein the second portion of each of the conductive structures has a substantially flat surface, and one or more cavities exist between edges of the conductive structures and edges of the interconnect portions of the substrate interconnect structures disposed in the first isolating layer openings;
(b) a second semiconductor structure, including:
(b1) a second substrate having first and second opposing surfaces;
(b2) one or more second interconnect pads each having a first surface disposed over and coupled to the second surface of the substrate; and
(b3) one or more fusible coupling structures having a first portion coupled to a respective one of the one or more second interconnect pads, and having a second portion disposed over and in contact with all exposed surfaces of corresponding ones of the conductive structures projecting from the surface of the interconnect pad and with at least a portion of the fusible coupling structure disposed in the cavities which exist between edges of the conductive structures and edges of the interconnect portions of the substrate interconnect structures disposed in the openings of said first isolating layer.

20. The semiconductor device of claim 19 wherein the fusible coupling structures are each provided as at least one of a solder ball or a self-aligned contact pad.

21. The semiconductor device of claim 19 wherein the first semiconductor structure is spaced apart from the second semiconductor structure by a predetermined distance, and the predetermined distance is based, at least in part, upon a size and shape of the conductive structures.

22. The semiconductor device of claim 21 wherein each of the conductive structures includes a plurality of stacked conductive structures, and a number of the plurality of stacked conductive structures is based upon the predetermined distance, wherein the first portion of a second one of the plurality of stacked conductive structures is disposed over the second portion of a first one of the plurality of stacked conductive structures, and the predetermined distance from which the first semiconductor structure is spaced apart from the second semiconductor structure is based, at least in part, upon a size and shape of each of the plurality of stacked conductive structures.

23. The semiconductor device of claim 19 wherein the first isolating layer of the first semiconductor structure includes a dielectric material, and the first isolating layer forms a dielectric bridge.

24. The semiconductor device of claim 19 wherein the second semiconductor structure further comprises a conductive material disposed on one or more edges of the second interconnect pads, wherein the conductive material is exposed on the edges of the second interconnect pads and substantially surrounds the conductive structures, and the conductive material includes a low surface energy metal such as Nickel, Platinum or Palladium.

25. The semiconductor device of claim 19 wherein the second semiconductor structure further comprises:
   an second isolating layer having first and second opposing surfaces and one or more openings formed in selected portions of the second isolating layer, wherein the first surface of the second isolating later is disposed over the second surface of the second substrate, and the second isolating layer openings extend between the second surface of the second isolating layer and the first surface of the second isolating layer,
   wherein the second interconnect pads are disposed in respective ones of the second isolating layer openings, and the first surface of each one of the second interconnect pads is coupled to surfaces of the second isolating layer openings and the second surface of the second substrate, and
   wherein the predetermined distance that the second portion of the conductive structures extends above the second surface of the first isolating layer is selected such that the conductive structures are capable of compensating for structural misalignment between the first semiconductor structure and the second semiconductor structure.

26. The semiconductor device of claim 19 wherein the first semiconductor structure further comprises a solder tip disposed over the second portion of the conductive structures, wherein the solder tip melts and overcoats at least a portion of each of the conductive structures, the first interconnect structures, the fusible coupling structures and the second interconnect structures when the second semiconductor structure is coupled to the first semiconductor structure.

* * * * *

UNITED STATES PATENT AND TRADEMARK OFFICE
CERTIFICATE OF CORRECTION

PATENT NO. : 9,786,633 B2
APPLICATION NO. : 14/694540
DATED : October 10, 2017
INVENTOR(S) : Rabindra N. Das et al.

It is certified that error appears in the above-identified patent and that said Letters Patent is hereby corrected as shown below:

In the Specification

Column 1, Line 37, delete "demand," and replace with --demand--

Column 1, Line 49, delete "above-reference" and replace with --above-referenced--

Column 1, Line 51, delete "La" and replace with --i.e.--

Column 1, Line 55, delete "Such interconnects," and replace with --Such interconnects--

Column 2, Line 5, delete "allow to" and replace with --allow--

Column 2, Line 6, delete "redesign a substrate" and replace with --redesign of a substrate--

Column 2, Line 25, delete "assemblies)" and replace with --assemblies--

Column 5, Line 23, delete "later" and replace with --layer--

Column 5, Line 25, delete "urn" and replace with --µm--

Column 5, Line 26, delete "um" and replace with --µm--

Column 5, Line 60, delete "Isolating" and replace with --isolating--

Column 5, Line 66, delete "Isolating" and replace with --isolating--

Column 10, Line 45, delete "tin-gold, indium, tin-silver-zinc," and replace with --tin-gold, tin-silver-zinc,--

Column 15, Line 7, delete "exist" and replace with --exists--

Signed and Sealed this
Eighteenth Day of June, 2019

Andrei Iancu
*Director of the United States Patent and Trademark Office*

Column 17, Line 14, delete "prism, cube, triangular" and replace with --prism, triangular--

Column 18, Line 27, delete "snorting" and replace with --shorting--

Column 19, Line 63, delete "630" and replace with --530--

Column 20, Line 18, delete "flip chi" and replace with --flip-chip--

Column 20, Line 61, delete "later" and replace with --layer--

Column 21, Line 32, delete "fin" and replace with --tin--

Column 21, Line 33, delete "tin-gold, indium, tin-silver-zinc," and replace with --tin-gold, tin-silver-zinc,--

Column 22, Line 42, delete "840" and replace with --640--

Column 22, Line 50, delete "Eutectic Tin" and replace with --eutectic tin--

Column 22, Lines 63-64, delete "Eutectic Tin" and replace with --eutectic tin--

Column 23, Line 35, delete "POP" and replace with --PoP--

Column 23, Line 59, delete "similar to method" and replace with --similar to the method--

Column 23, Line 63, delete "en" and replace with --an--

Column 24, Line 54, delete "amount a" and replace with --amount of--

Column 25, Line 8, delete "tip 960" and replace with --tip 980--

Column 27, Line 23, delete "fusible structure" and replace with --fusible structures--

In the Claims

Column 33, Line 23, delete "an second" and replace with --a second--